(12) United States Patent  
Kurokawa

(10) Patent No.: US 9,851,942 B2  
(45) Date of Patent: Dec. 26, 2017

(54) SEMICONDUCTOR DEVICE

(71) Applicant: Semiconductor Energy Laboratory Co., Ltd., Atsugi-shi, Kanagawa-ken (JP)

(72) Inventor: Yoshiyuki Kurokawa, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 15/443,015

(22) Filed: Feb. 27, 2017

(65) Prior Publication Data

US 2017/0263291 A1 Sep. 14, 2017

(30) Foreign Application Priority Data

Mar. 10, 2016 (JP) ................................. 2016-046853

(51) Int. Cl.
*G06F 7/00* (2006.01)
*G11C 5/06* (2006.01)
*G06F 17/00* (2006.01)

(52) U.S. Cl.
CPC ................ *G06F 7/00* (2013.01); *G06F 17/00* (2013.01); *G11C 5/063* (2013.01)

(58) Field of Classification Search
CPC ........ G06F 7/00; G06F 17/00; G06F 12/0875; G06F 19/22; G06F 2212/452
See application file for complete search history.

(56) References Cited

U.S. PATENT DOCUMENTS

| 6,147,630 A | 11/2000 | Sasai et al. |
| 2005/0122238 A1 | 6/2005 | Nomura et al. |
| 2006/0206555 A1 | 9/2006 | Nomura et al. |

(Continued)

FOREIGN PATENT DOCUMENTS

| CN | 001867888 A | 11/2006 |
| EP | 1676197 A | 7/2006 |

(Continued)

OTHER PUBLICATIONS

International Search Report (Application No. PCT/IB2017/051116) dated May 16, 2017.

(Continued)

*Primary Examiner* — Harry W Byrne
*Assistant Examiner* — Ajay Ojha
(74) *Attorney, Agent, or Firm* — Fish & Richardson P.C.

(57) ABSTRACT

The circuit scale of a semiconductor device that can perform arithmetic processing of analog data is reduced. In the semiconductor device, a memory cell is configured to generate a first current corresponding to first analog data and to generate a second current corresponding to the first analog data and second analog data. A reference memory cell is configured to generate a reference current corresponding to reference data. A first circuit is configured to generate and hold a third current corresponding to the difference between the first current and the reference current when the first current is lower than the reference current. A second circuit is configured to generate and hold a fourth current corresponding to the difference between the first current and the reference current when the first current is higher than the reference current. One of the first circuit and the second circuit is configured to generate a fifth current corresponding to third analog data.

14 Claims, 15 Drawing Sheets

(56) References Cited

U.S. PATENT DOCUMENTS

| | | |
|---|---|---|
| 2016/0295152 A1 | 10/2016 | Kurokawa |
| 2016/0343452 A1 | 11/2016 | Ikeda et al. |
| 2017/0063351 A1 | 3/2017 | Kurokawa |
| 2017/0116512 A1 | 4/2017 | Kurokawa |
| 2017/0118479 A1 | 4/2017 | Kurokawa |

FOREIGN PATENT DOCUMENTS

| | | |
|---|---|---|
| JP | 04-067259 A | 3/1992 |
| JP | 11-341347 A | 12/1999 |
| JP | 2004-110421 A | 4/2004 |
| JP | 2005-122466 A | 5/2005 |
| JP | 2005-122467 A | 5/2005 |
| JP | 2016-197484 A | 11/2016 |
| WO | WO-2005/038645 | 4/2005 |

OTHER PUBLICATIONS

Written Opinion (Application No. PCT/IB2017/051116) dated May 16, 2017.
Aslam-Siddiqi.A et al., "A 16×16 Nonvolatile Programmable Analog Vector-Matrix Multiplier", IEEE Journal of Solid-State Circuits, Oct. 1, 1998, vol. 33, No. 10, pp. 1502-1509.

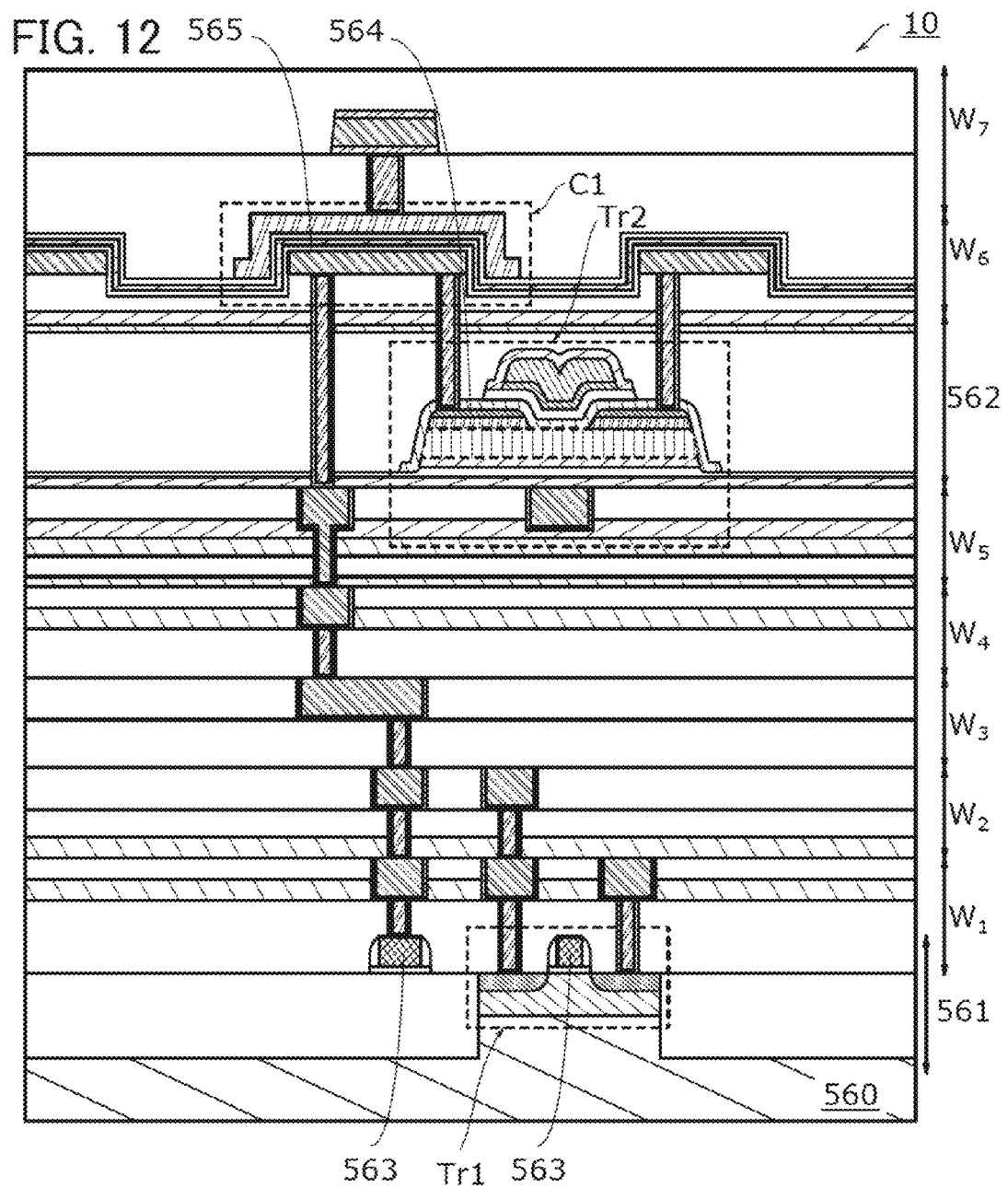

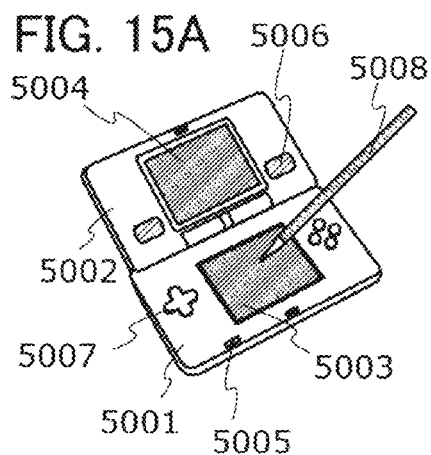
FIG. 15A
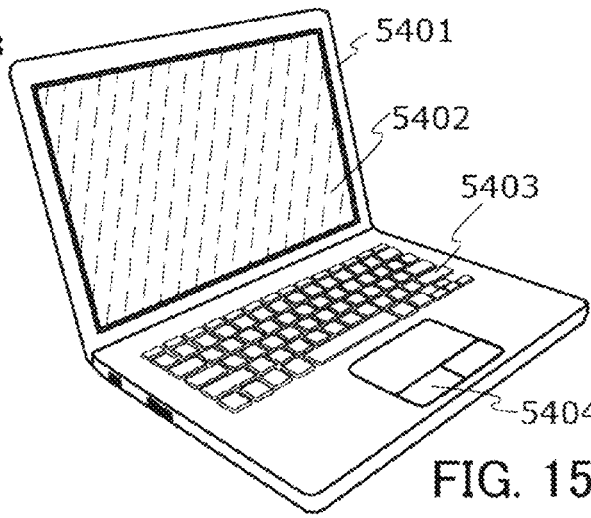
FIG. 15B
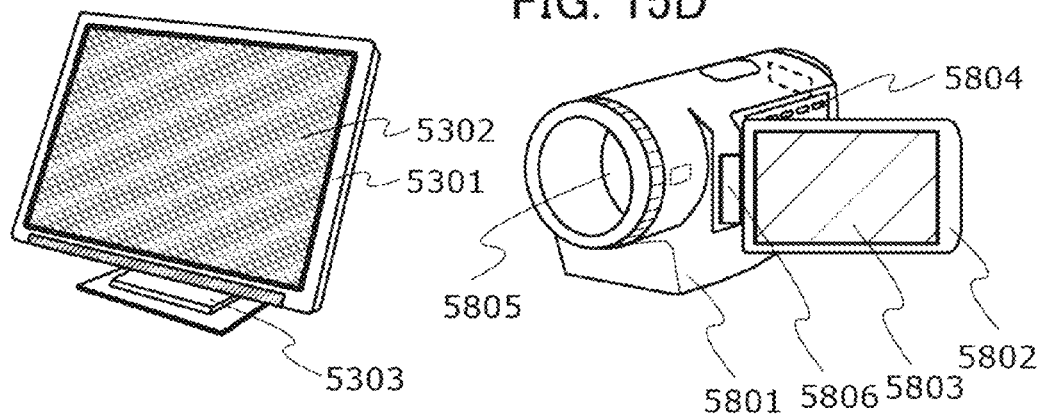
FIG. 15C
FIG. 15D
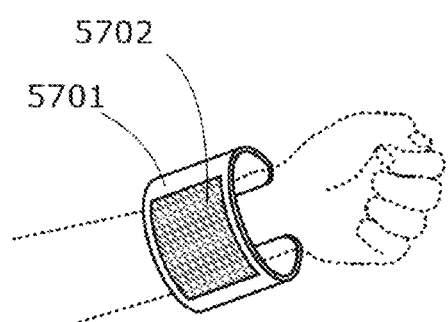
FIG. 15E
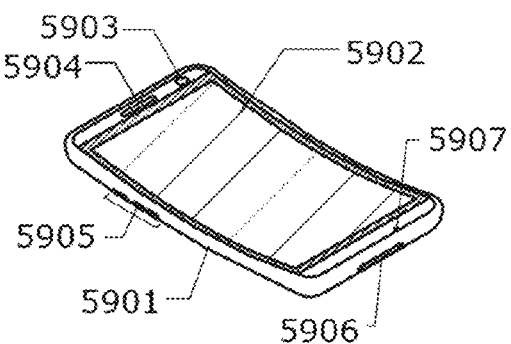
FIG. 15F

SEMICONDUCTOR DEVICE

TECHNICAL FIELD

One embodiment of the present invention relates to a semiconductor device such as an arithmetic processing circuit that manipulates analog data.

Note that one embodiment of the present invention is not limited to the above technical field. The technical field of one embodiment of the invention disclosed in this specification and the like relates to an object, a method, or a manufacturing method. Furthermore, one embodiment of the present invention relates to a process, a machine, manufacture, or a composition of matter. Specifically, examples of the technical field of one embodiment of the present invention disclosed in this specification include a semiconductor device, a display device, a liquid crystal display device, a light-emitting device, a lighting device, a power storage device, a memory device, a method for driving any of them, and a method for manufacturing any of them.

BACKGROUND ART

Arithmetic processing performed after conversion of analog data into digital data requires massive arithmetic processing. As a result, it is difficult to shorten the time for the arithmetic processing. Thus, a variety of methods for performing arithmetic processing without converting analog data into digital data, as in analog data processing performed by a brain where a neuron is a fundamental component, have been proposed.

Patent Document 1 discloses an arithmetic circuit that can simultaneously execute independent nonlinear transformation processing and weighting processing.

REFERENCE

Patent Document

[Patent Document 1] Japanese Published Patent Application No. 2004-110421

DISCLOSURE OF INVENTION

Product-sum operation processing is arithmetic processing often used in a digital circuit. Product-sum operation processing of analog data by a digital circuit can be performed in the following specific manner: a multiplier circuit multiplies a plurality of pieces of first digital data and a plurality of pieces of second digital data that correspond to the plurality of pieces of first digital data together; a plurality of pieces of third digital data that correspond to the multiplication results are stored in a digital memory; the plurality of pieces of third digital data are read out from the digital memory in succession; and an adder circuit performs the summation of the plurality of pieces of third digital data. As apparent from the above, storing of the third digital data into the digital memory and reading of the data from the digital memory need to be frequently performed in the product-sum operation processing performed by the digital circuit. This means that the arithmetic processing speed depends on the access speed to the digital memory. The time required for the arithmetic processing can be shortened by providing a plurality of multiplier circuits or adder circuits in the digital circuit; in that case, however, it is difficult to suppress the power consumption of the digital circuit.

In view of the foregoing technical background, an object of one embodiment of the present invention is to reduce the circuit scale of a semiconductor device that can perform arithmetic processing of analog data. Another object of one embodiment of the present invention is to provide a semiconductor device with which the time required for arithmetic processing of analog data can be shortened. Another object of one embodiment of the present invention is to reduce power consumption of a semiconductor device that can perform arithmetic processing of analog data.

An object of one embodiment of the present invention is to provide a novel semiconductor device or the like. Note that the descriptions of these objects do not disturb the existence of other objects. One embodiment of the present invention does not need to achieve all the objects. Other objects will be apparent from and can be derived from the description of the specification, the drawings, the claims, and the like.

In view of the above objects, a semiconductor device of one embodiment of the present invention includes a memory cell, a reference memory cell, a first circuit, and a second circuit. The memory cell is configured to generate a first current corresponding to first analog data and to generate a second current corresponding to the first analog data and second analog data. The reference memory cell is configured to generate a reference current corresponding to reference data. The first circuit is configured to generate and hold a third current corresponding to a difference between the first current and the reference current when the first current is lower than the reference current. The second circuit is configured to generate and hold a fourth current corresponding to a difference between the first current and the reference current when the first current is higher than the reference current. One of the first circuit and the second circuit is configured to generate a fifth current corresponding to third analog data from the second current and one of the third current and the fourth current.

In view of the above objects, a semiconductor device of one embodiment of the present invention includes a first memory cell, a second memory cell, a first reference memory cell, a second reference memory cell, a first circuit, and a second circuit. The first memory cell is configured to generate a first current corresponding to first analog data and to generate a second current corresponding to the first analog data and second analog data. The second memory cell is configured to generate a third current corresponding to third analog data and to generate a fourth current corresponding to the third analog data and fourth analog data. The first reference memory cell is configured to generate a first reference current corresponding to reference data. The second reference memory cell is configured to generate a second reference current corresponding to the reference data. The first circuit is configured to generate and hold a fifth current corresponding to a difference between a sum of the first current and the third current and a sum of the first reference current and the second reference current when the sum of the first current and the third current is smaller than the sum of the first reference current and the second reference current. The second circuit is configured to generate and hold a sixth current corresponding to a difference between the sum of the first current and the third current and the sum of the first reference current and the second reference current when the sum of the first current and the third current is larger than the sum of the first reference current and the second reference current. One of the first circuit and the second circuit is configured to generate a seventh current corresponding to fifth analog data from a sum of the second current and the fourth current and one of the fifth current and the sixth current.

One embodiment of the present invention can reduce the circuit scale of a semiconductor device that can perform arithmetic processing of analog data. Another embodiment of the present invention can provide a semiconductor device with which the time required for arithmetic processing of analog data can be shortened. Another embodiment of the present invention can reduce power consumption of a semiconductor device that can perform arithmetic processing of analog data.

Another embodiment of the present invention can provide a novel semiconductor device or the like. Note that the description of these effects does not preclude the existence of other effects. One embodiment of the present invention does not necessarily achieve all the effects listed above. Other effects will be apparent from and can be derived from the description of the specification, the drawings, the claims, and the like.

BRIEF DESCRIPTION OF DRAWINGS

FIG. 12 illustrates a cross-sectional structure of a semiconductor device.

FIGS. 15A to 15F illustrate electronic devices.

BEST MODE FOR CARRYING OUT THE INVENTION

Figure 1:
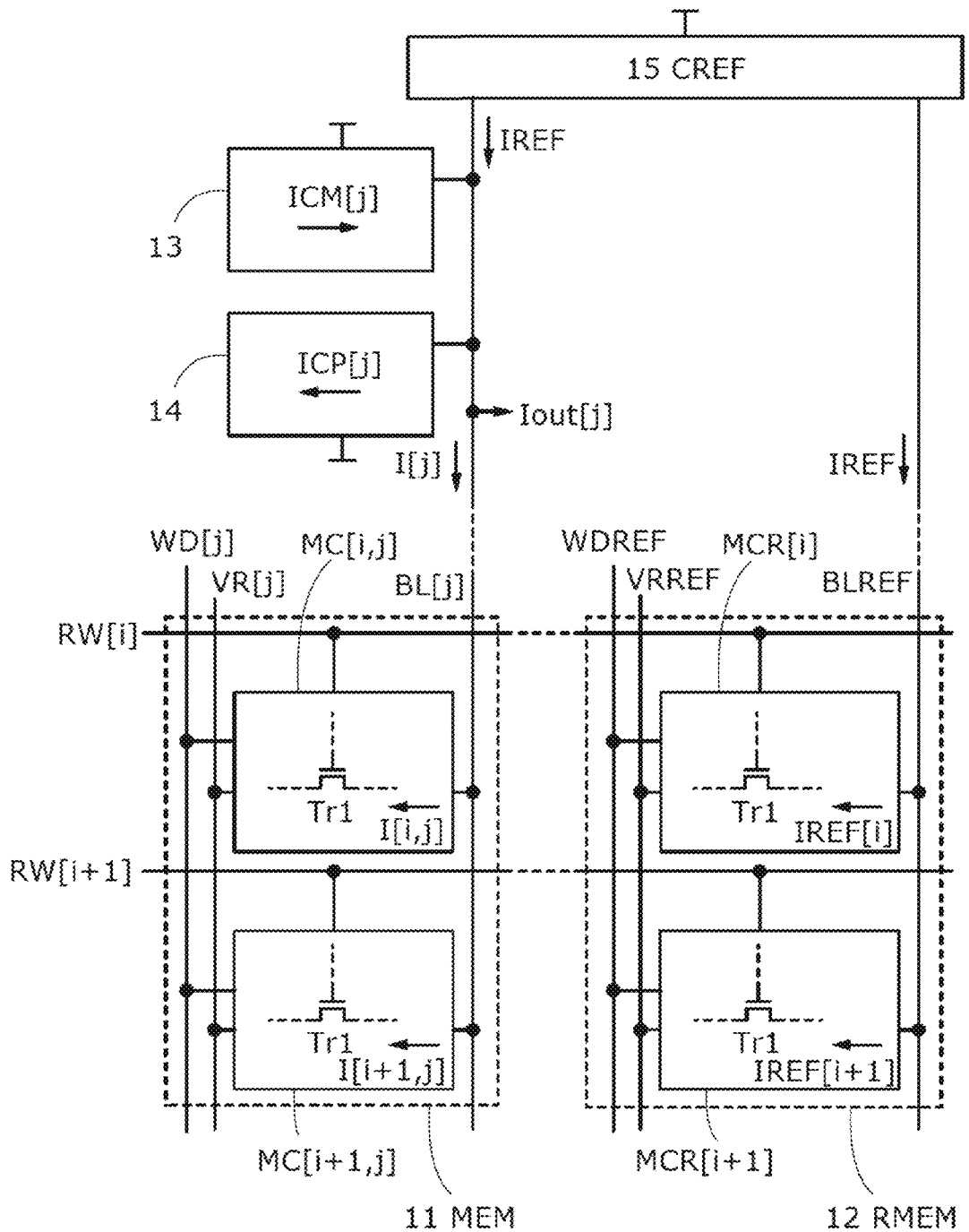
FIG. 1 illustrates a configuration of a semiconductor device.

Hereinafter, embodiments of the present invention will be described in detail with reference to the accompanying drawings. However, the present invention is not limited to the following description and it is easily understood by those skilled in the art that the mode and details can be variously changed without departing from the scope and spirit of the present invention. Accordingly, the present invention should not be construed as being limited to the description of the embodiments below.

In the drawings, the size, the layer thickness, or the region is exaggerated for clarity in some cases. Therefore, the size, the layer thickness, or the region is not limited to the illustrated scale. Note that the drawings are schematic views showing ideal examples, and embodiments of the present invention are not limited to shapes or values shown in the drawings. For example, the following can be included: variation in signal, voltage, or current due to noise or difference in timing.

In this specification, terms for describing arrangement, such as "over," "above," "under," and "below," are used for convenience in describing a positional relationship between components with reference to drawings in some cases. Furthermore, the positional relationship between components is changed as appropriate in accordance with a direction in which each component is described. Thus, there is no limitation on terms used in this specification, and description can be made appropriately depending on the situation.

The positional relation of circuit blocks illustrated in a block diagram is specified for description. Even when a block diagram shows that different functions are achieved by different circuit blocks, one circuit block may be actually configured to achieve different functions. The functions of circuit blocks are specified for description, and even in the case where one circuit block is illustrated, blocks might be provided in an actual circuit block so that processing performed by one circuit block is performed by a plurality of circuit blocks.

In this specification and the like, a semiconductor device refers to a device that utilizes semiconductor characteristics, and means a circuit including a semiconductor element (e.g., a transistor or a diode), a device including the circuit, and the like. The semiconductor device also means any device that can function by utilizing semiconductor characteristics. For example, an integrated circuit, and a chip including an integrated circuit are semiconductor devices. Moreover, a storage device, a display device, a light-emitting device, a lighting device, an electronic device, and the like themselves might be semiconductor devices, or might each include a semiconductor device.

In this specification and the like, when it is explicitly described that X and Y are connected, the case where X and Y are electrically connected, the case where X and Y are functionally connected, and the case where X and Y are directly connected are included therein. Accordingly, without being limited to a predetermined connection relationship, for example, a connection relationship shown in drawings or texts, another connection relationship is included in the drawings or the texts. Here, X and Y denote an object (e.g., a device, an element, a circuit, a wiring, an electrode, a terminal, a conductive film, a layer, or the like).

A transistor includes three terminals: a gate, a source, and a drain. A gate is a node that controls the conduction state of a transistor. Depending on the channel type of the transistor or levels of a potential applied to the terminals, one of two input/output nodes functions as a source and the other functions as a drain. Therefore, the terms "source" and "drain" can be used interchangeably in this specification and the like. In this specification and the like, the two terminals other than the gate may be referred to as a first terminal and a second terminal.

A node can be referred to as a terminal, a wiring, an electrode, a conductive layer, a conductor, an impurity region, or the like depending on the circuit configuration, the device structure, or the like. Furthermore, a terminal, a wiring, or the like can be referred to as a node.

In many cases, a voltage refers to a potential difference between a certain potential and a reference potential (e.g., a ground potential (GND) or a source potential). Thus, a voltage can also be referred to as a potential. Note that the potential indicates a relative value. Accordingly, "ground potential" does not necessarily mean 0 V.

In this specification and the like, the terms "film" and "layer" can be interchanged depending on the case or circumstances. For example, a term "conductive layer" can be changed to a term "conductive film" in some cases. For example, a term "insulating film" can be changed to a term "insulating layer" in some cases.

In this specification and the like, ordinal numbers such as first, second, and third are used to avoid confusion among components, and the terms do not limit the components numerically or do not limit the order.

Embodiment 1

FIG. 1 illustrates a configuration example of a semiconductor device 10 of one embodiment of the present invention. The semiconductor device 10 illustrated in FIG. 1 includes a memory circuit 11 (MEM), a reference memory circuit 12 (RMEM), a circuit 13, and a circuit 14. The semiconductor device 10 may further include a current supply circuit 15 (CREF).

The memory circuit 11 (MEM) includes a memory cell MC such as a memory cell MC[i, j] and a memory cell MC[i+1, j]. The memory cell MC includes an element that has a function of converting an input potential into current. As the element having such a function, an active element such as a transistor can be used, for example. FIG. 1 illustrates an example where the memory cell MC includes a transistor Tr1.

Note that a first analog potential is input to the memory cell MC through a wiring WD such as a wiring WD[j]. The first analog potential corresponds to first analog data. The memory cell MC has a function of generating a first analog current corresponding to the first analog potential. Specifically, drain current of the transistor Tr1, which is obtained when the first analog potential is supplied to a gate of the transistor Tr1, can be used as the first analog current. Hereinafter, current flowing in the memory cell MC[i, j] is denoted by I[i, j], and current flowing in the memory cell MC[i+1, j] is denoted by I[i+1, j].

The drain current of the transistor Tr1 operating in a saturation region is not dependent on voltage between a source and a drain and is controlled by the difference between its gate voltage and threshold voltage. Thus, the transistor Tr1 desirably operates in a saturation region. Note that the gate voltage and the voltage between the source and the drain of the transistor Tr1 are each appropriately set to a voltage at which the transistor Tr1 operates in a saturation region.

Specifically, in the semiconductor device 10 illustrated in FIG. 1, a first analog potential Vx[i, j] or a potential corresponding to the first analog potential Vx[i, j] is input to the memory cell MC[i, j] through the wiring WD[j]. The memory cell MC[i, j] has a function of generating a first analog current corresponding to the first analog potential Vx[i, j]. This means that the current I[i, j] flowing in the memory cell MC[i, j] corresponds to the first analog current, in this case.

Furthermore, in the semiconductor device 10 illustrated in FIG. 1, a first analog potential Vx[i+1, j] or a potential corresponding to the first analog potential Vx[i+1, j] is input to the memory cell MC[i+1, j] through the wiring WD[j]. The memory cell MC[i+1, j] has a function of generating a first analog current corresponding to the first analog potential Vx[i+1, j]. This means that the current I[i+1, j] flowing in the memory cell MC[i+1, j] corresponds to the first analog current, in this case.

The memory cell MC has a function of holding the first analog potential. In other words, the memory cell MC has a function of holding the first analog current corresponding to the first analog potential.

Moreover, a second analog potential is input to the memory cell MC through a wiring RW such as a wiring RW[i] and a wiring RW[i+1]. The second analog potential corresponds to second analog data. The memory cell MC has a function of adding the second analog potential or a potential corresponding to the second analog potential to the first analog potential that is held and a function of holding a third analog potential obtained by the addition. The memory cell MC also has a function of generating a second analog current corresponding to the third analog potential. In other words, the memory cell MC has a function of holding the second analog current corresponding to the third analog potential.

Specifically, in the semiconductor device 10 illustrated in FIG. 1, a second analog potential Vw[i, j] is input to the memory cell MC[i, j] through the wiring RW[i]. The memory cell MC[i, j] has a function of holding a third analog potential corresponding to the first analog potential Vx[i, j] and the second analog potential Vw[i, j]. The memory cell MC[i, j] also has a function of generating a second analog current corresponding to the third analog potential. This means that the current I[i, j] flowing in the memory cell MC[i, j] corresponds to the second analog current, in this case.

Furthermore, in the semiconductor device 10 illustrated in FIG. 1, a second analog potential Vw[i+1, j] is input to the memory cell MC[i+1, j] through the wiring RW[i+1]. The memory cell MC[i+1, j] has a function of holding the first analog potential Vx[i+1, j] and a third analog potential corresponding to the second analog potential Vw[i+1, j]. The memory cell MC[i+1, j] also has a function of generating a second analog current corresponding to the third analog potential. This means that the current I[i+1, j] flowing in the memory cell MC[i+1, j] corresponds to the second analog current, in this case.

The current I[i, j] flows between a wiring BL[j] and a wiring VR[j] through the memory cell MC[i, j]. The current I[i+1, j] flows between the wiring BL[j] and the wiring VR[j] through the memory cell MC[i+1, j]. Accordingly, a current I[j], which corresponds to the sum of the current I[i, j] and the current I[i+1, j], flows between the wiring BL[j] and the wiring VR[j] through the memory cell MC[i, j] and the memory cell MC[i+1, j].

The reference memory circuit 12 (RMEM) includes a memory cell MCR such as a memory cell MCR[i] and a memory cell MCR[i+1]. Note that a first reference potential VPR is input to the memory cell MCR through a wiring WDREF. The memory cell MCR has a function of generating a first reference current corresponding to the first reference potential VPR. Hereinafter, current flowing in the memory cell MCR[i] is denoted by IREF[i], and current flowing in the memory cell MCR[i+1] is denoted by IREF[i+1].

Specifically, in the semiconductor device 10 illustrated in FIG. 1, the first reference potential VPR is input to the memory cell MCR[i] through the wiring WDREF. The memory cell MCR[i] has a function of generating the first reference current corresponding to the first reference potential VPR. This means that the current IREF[i] flowing in the memory cell MCR[i] corresponds to the first reference current, in this case.

Furthermore, in the semiconductor device 10 illustrated in FIG. 1, the first reference potential VPR is input to the memory cell MCR[i+1] through the wiring WDREF. The memory cell MCR[i+1] has a function of generating the first reference current corresponding to the first reference potential VPR. This means that the current IREF[i+1] flowing in the memory cell MCR[i+1] corresponds to the first reference current, in this case.

The memory cell MCR has a function of holding the first reference potential VPR. In other words, the memory cell MCR has a function of holding the first reference current corresponding to the first reference potential VPR.

Moreover, the second analog potential is input to the memory cell MCR through the wiring RW such as the wiring RW[i] and the wiring RW[i+1]. The memory cell MCR has a function of adding the second analog potential or a potential corresponding to the second analog potential to the first reference potential VPR that is held and a function of holding a second reference potential obtained by the addition. The memory cell MCR also has a function of generating a second reference current corresponding to the second reference potential. In other words, the memory cell MCR has a function of holding the second reference current corresponding to the second reference potential.

Specifically, in the semiconductor device 10 illustrated in FIG. 1, the second analog potential Vw[i, j] is input to the memory cell MCR[i] through the wiring RW[i]. The memory cell MCR[i] has a function of holding a second reference potential corresponding to the first reference potential VPR and the second analog potential Vw[i, j]. The memory cell MCR[i] also has a function of generating the second reference current corresponding to the second reference potential. This means that the current IREF[i] flowing in the memory cell MCR[i] corresponds to the second reference current, in this case.

Furthermore, in the semiconductor device 10 illustrated in FIG. 1, the second analog potential Vw[i+1, j] is input to the memory cell MCR[i+1] through the wiring RW[i+1]. The memory cell MCR[i+1] has a function of holding the first reference potential VPR and a second reference potential corresponding to the second analog potential Vw[i+1, j]. The memory cell MCR[i+1] also has a function of generating the second reference current corresponding to the second reference potential. This means that the current IREF[i+1] flowing in the memory cell MCR[i+1] corresponds to the second reference current, in this case.

The current IREF[i] flows between a wiring BLREF and a wiring VRREF through the memory cell MCR[i]. The current IREF[i+1] flows between the wiring BLREF and the wiring VRREF through the memory cell MCR[i+1]. Accordingly, a current IREF, which corresponds to the sum of the current IREF[i] and the current IREF[i+1], flows between the wiring BLREF and the wiring VRREF through the memory cell MCR[i] and the memory cell MCR[i+1].

The current supply circuit 15 has a function of supplying current with the same value as the current IREF that flows through the wiring BLREF or supplying current corresponding to the current IREF to the wiring BL. In the case where the current I[j] that flows between the wiring BL[j] and the wiring VR[j] through the memory cell MC[i, j] and the memory cell MC[i+1, j] is different from the current IREF that flows between the wiring BLREF and the wiring VRREF through the memory cell MCR[i] and the memory cell MCR[i+1] and thus offset current is set as described later, current corresponding to the difference flows in the circuit 13 or the circuit 14. The circuit 13 functions as a current source circuit, and the circuit 14 functions as a current sink circuit.

Specifically, in the case where the current I[j] is higher than the current IREF, the circuit 13 has a function of generating a current ΔI[j] that corresponds to the difference between the current I[j] and the current IREF. The circuit 13 also has a function of supplying the generated current ΔI[j] to the wiring BL[j]. This means that the circuit 13 has a function of holding the current ΔI[j].

In the case where the current I[j] is lower than the current IREF, the circuit 14 has a function of generating the current ΔI[j] that corresponds the difference between the current I[j] and the current IREF. The circuit 14 also has a function of drawing current corresponding to the absolute value of the generated current ΔI[j] from the wiring BL[j]. This means that the circuit 14 has a function of holding the current ΔI[j].

Next, an operation example of the semiconductor device 10 illustrated in FIG. 1 will be described.

First, a potential corresponding to the first analog potential is stored in the memory cell MC[i, j]. Specifically, a potential VPR−Vx[i, j], which is obtained by subtracting the first analog potential Vx[i, j] from the first reference potential VPR, is input to the memory cell MC[i, j] through the wiring WD[j]. The memory cell MC[i, j] holds the potential VPR−Vx[i, j]. In addition, the memory cell MC[i, j] generates the current I[i, j] that corresponds to the potential VPR−Vx[i, j]. The first reference potential VPR is, for example, a high-level potential that is higher than a ground potential. Specifically, the first reference potential VPR is desirably higher than a ground potential and as high as or lower than a high-level potential VDD that is supplied to the current supply circuit 15.

Furthermore, the first reference potential VPR is stored in the memory cell MCR[i]. Specifically, the first reference potential VPR is input to the memory cell MCR[i] through the wiring WDREF. The memory cell MCR[i] holds the first reference potential VPR. In addition, the memory cell MCR[i] generates the current IREF[i] that corresponds to the first reference potential VPR.

Moreover, a potential corresponding to the first analog potential is stored in the memory cell MC[i+1, j]. Specifically, a potential VPR−Vx[i+1, j], which is obtained by subtracting the first analog potential Vx[i+1, j] from the first reference potential VPR, is input to the memory cell MC[i+1, j] through the wiring WD[j]. The memory cell MC[i+1, j] holds the potential VPR−Vx[i+1, j]. In addition, the memory cell MC[i+1, j] generates the current I[i+1, j] that corresponds to the potential VPR−Vx[i+1, j].

Furthermore, the first reference potential VPR is stored in the memory cell MCR[i+1]. Specifically, the first reference potential VPR is input to the memory cell MCR[i+1] through the wiring WDREF. The memory cell MCR[i+1] holds the first reference potential VPR. In addition, the memory cell MCR[i+1] generates the current IREF[i+1] that corresponds to the first reference potential VPR.

During the above operation, the wiring RW[i] and the wiring RW[i+1] are each set to a base potential. As a base potential, for example, a ground potential or a low-level potential VSS that is lower than a ground potential can be used. Alternatively, a potential between the potential VSS and the potential VDD may be used as a base potential. This is preferable because the potential of the wiring RW can be higher than a ground potential regardless of whether the second analog potential Vw is positive or negative, which enables easy generation of signals and multiplication of either positive or negative analog data.

As a result of the above operation, current corresponding to the sum of currents generated in the memory cells MC electrically connected to the wiring BL[j] flows through the wiring BL[j]. Specifically, in FIG. 1, the current I[j], which is the sum of the current I[i, j] generated in the memory cell MC[i, j] and the current I[i+1, j] generated in the memory cell MC[i+1, j], flows through the wiring BL[j]. In addition, as a result of the above operation, current corresponding to the sum of currents generated in the memory cells MCR electrically connected to the wiring BLREF flows through the wiring BLREF. Specifically, in FIG. 1, the current IREF, which is the sum of the current IREF[i] generated in the memory cell MCR[i] and the current IREF[i+1] generated in the memory cell MCR[i+1], flows through the wiring BLREF.

Next, an offset current Ioffset[j], which is the difference between the current I[j] obtained by inputting the first analog potential and the current IREF obtained by inputting the first reference potential, is held in the circuit 13 or the circuit 14 while the wiring RW[i] and the wiring RW[i+1] are kept at base potentials.

Specifically, when the current I[j] is higher than the current IREF, the circuit 13 supplies the current Ioffset[j] to the wiring BL[j]. This means that a current ICM[j] that flows in the circuit 13 corresponds to the current Ioffset[j]. The current ICM[j] is held in the circuit 13. When the current I[j] is lower than the current IREF, the circuit 14 draws the current Ioffset[j] from the wiring BL[j]. This means that a current ICP[j] that flows in the circuit 14 corresponds to the current Ioffset[j]. The current ICP[j] is held in the circuit 14.

Then, the second analog potential or a potential corresponding to the second analog potential is stored in the memory cell MC[i, j] so as to be added to the first analog potential or a potential corresponding to the first analog potential held in the memory cell MC[i, j]. Specifically, when the potential of the wiring RW[i] is set to a potential that is higher than a base potential by Vw[i], a second analog potential Vw[i] is input to the memory cell MC[i, j] through the wiring RW[i]. The memory cell MC[i, j] holds a potential VPR−Vx[i, j]+Vw[i]. Furthermore, the memory cell MC[i, j] generates the current I[i, j] corresponding to the potential VPR−Vx[i, j]+Vw[i].

In addition, the second analog potential or the potential corresponding to the second analog potential is stored in the memory cell MC[i+1, j] so as to be added to the first analog potential or a potential corresponding to the first analog potential held in the memory cell MC[i+1, j]. Specifically, when the potential of the wiring RW[i+1] is set to a potential that is higher than a base potential by Vw[i+1], a second analog potential Vw[i+1] is input to the memory cell MC[i+1, j] through the wiring RW[i+1]. The memory cell MC[i+1, j] holds a potential VPR−Vx[i+1, j]+Vw[i+1]. Furthermore, the memory cell MC[i+1, j] generates the current I[i+1, j] corresponding to the potential VPR−Vx[i+1, j]+Vw[i+1].

In the case where the transistor Tr1 that operates in a saturation region is used as an element for converting a potential into current, since the drain current of the transistor Tr1 included in the memory cell MC[i, j] corresponds to the current I[i, j], the second analog current is expressed by Formula 1 below. Note that Vw[i] is the potential of the wiring RW[i], Vw[i+1] is the potential of the wiring RW[i+1], k is a coefficient, and Vth is the threshold voltage of the transistor Tr1.

$$I[i, j]=k(Vw[i]-Vth+VPR-Vx[i, j])^2 \quad \text{(Formula 1)}$$

Furthermore, since the drain current of the transistor Tr1 included in the memory cell MCR[i] corresponds to the current IREF[i], the second reference current is expressed by Formula 2 below.

$$IREF[i]=k(Vw[i]-Vth+VPR)^2 \quad \text{(Formula 2)}$$

The current I[j], which corresponds to the sum of the current I[i, j] flowing in the memory cell MC[i, j] and the current I[i+1, j] flowing in the memory cell MC[i+1, j], can be expressed as ΣiI[i, j]. The current IREF, which corresponds to the sum of the current IREF[i] flowing in the memory cell MCR[i] and the current IREF[i+1] flowing in the memory cell MCR[i+1], can be expressed as ΣiIREF[i]. Accordingly, the current ΔI[j] that correspond to the difference between the current I[j] and the current IREF is expressed by Formula 3 below.

$$\Delta I[j]=IREF-I[j]=\Sigma iIREF[i]-\Sigma i,I[j] \quad \text{(Formula 3)}$$

The current ΔI[j] can be obtained from Formulae 1 to 3, as expressed by Formula 4 below.

$$\Sigma I[j]=\Sigma i\{k(Vw[i]-Vth+VPR)^2-k(Vw[i]-Vth+VPR-Vx[i, j])^2\}=2k\Sigma i(Vw[i]\cdot Vx[i, j])-2k\Sigma i(Vth-VPR)\cdot Vx[i, j]-k\Sigma iVx[i, j]^2 \quad \text{(Formula 4)}$$

The term 2kΣ(Vw[i]·Vx[i, j]) in Formula 4 corresponds to the sum of the product of the first analog potential Vx[i, j] and the second analog potential Vw[i] and the product of the first analog potential Vx[i+1, j] and the second analog potential Vw[i+1].

Furthermore, if the current Ioffset[j] is defined as the current ΔI[i] at the time when the potential of the wiring RW is set to a base potential, that is, when the second analog potential Vw[i] and the second analog potential Vw[i+1] are both 0, Formula 5 below can be obtained from Formula 4.

$$Ioffset[j]=-2k\Sigma i(Vth-VPR)\cdot Vx[i, j]-k\Sigma Vx[i, j]^2 \quad \text{(Formula 5)}$$

It is found from Formulae 3 to 5 that 2kΣi(Vw[i]·Vx[i, j]) that corresponds to the product-sum of the first analog data and the second analog data is expressed by Formula 6 below.

$$2k\Sigma i(Vw[i]\cdot Vx[i, j])=IREF-I[j]-Ioffset[j] \quad \text{(Formula 6)}$$

When the potential of the wiring RW[i] is Vw[i] and the potential of the wiring RW[i+1] is Vw[i+1], a current Iout[j] that flows from the wiring BL[j] is expressed by IREF−I[j]−Ioffset[j], where I[j] is the sum of currents flowing in the memory cells MC, IREF is the sum of currents flowing in the memory cells MCR, and Ioffset[j] is current flowing in the circuit 13 or the circuit 14. According to Formula 6, the current Iout[j] equals to 2kΣi(Vw[i]·Vx[i, j]), which corresponds to the sum of the product of the first analog potential Vx[i, j] and the second analog potential Vw[i] and the product of the first analog potential Vx[i+1, j] and the second analog potential Vw[i+1].

The transistor Tr1 desirably operates in a saturation region. However, even if the operation region of the transistor Tr1 deviates from an ideal saturation region, the transistor Tr1 is regarded as operating in a saturation region as long as there is no problem in obtaining current that corresponds to the sum of the product of the first analog potential Vx[i, j] and the second analog potential Vw[i] and the product of the first analog potential Vx[i+1, j] and the second analog potential Vw[i+1] with an accuracy within a desired range.

According to one embodiment of the present invention, analog data can be subjected to arithmetic processing without being converted into digital data; thus, the circuit scale of a semiconductor device can be reduced or the time required for the arithmetic processing of analog data can be shortened. Alternatively, according to one embodiment of the present invention, power consumption of a semiconductor device can be reduced while the time required for arithmetic processing of analog data is shortened.

This embodiment can be implemented in appropriate combination with any of the other embodiments.

Embodiment 2

Next, a specific configuration example of the memory circuit 11 (MEM) and the reference memory circuit 12 (RMEM) will be described with reference to FIG. 2.

Figure 2:
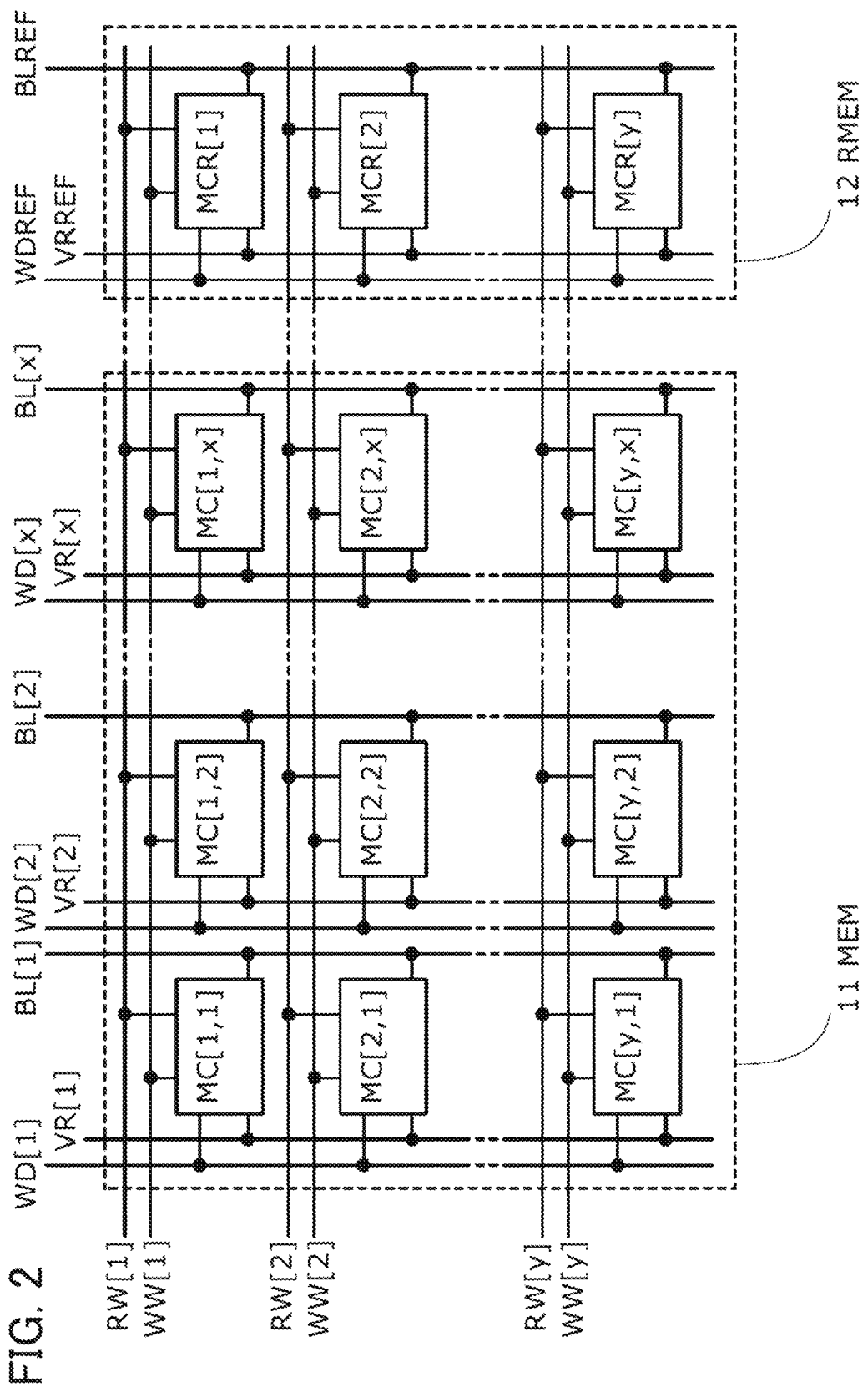
FIG. 2 illustrates a specific configuration of a memory circuit and a reference memory circuit.

FIG. 2 illustrates an example where the memory circuit 11 (MEM) includes the memory cells MC in y rows and x columns (x and y are natural numbers) and the reference memory circuit 12 (RMEM) includes the memory cells MCR in y rows and one column.

The memory circuit 11 is electrically connected to the wiring RW, a wiring WW, the wiring WD, the wiring VR, and the wiring BL. In the example illustrated in FIG. 2, wirings RW[1] to RW[y] and wirings WW[1] to WW[y] are electrically connected to the memory cells MC in the respective rows. Moreover, wirings WD[1] to WD[x], wirings BL[1] to BL[x], and wirings VR[1] to VR[x] are electrically connected to the memory cells MC in the respective columns. Note that the wirings VR[1] to VR[x] may be electrically connected to each other.

The reference memory circuit 12 is electrically connected to the wiring RW, the wiring WW, the wiring WDREF, the wiring VRREF, and the wiring BLREF. In the example illustrated in FIG. 2, the wirings RW[1] to RW[y] and the wirings WW[1] to WW[y] are electrically connected to the memory cells MCR in the respective rows. Moreover, the wiring WDREF, the wiring BLREF, and the wiring VRREF are electrically connected to the memory cells MCR in the one column. Note that the wiring VRREF may be electrically connected to the wirings VR[1] to VR[x].

Figure 3:
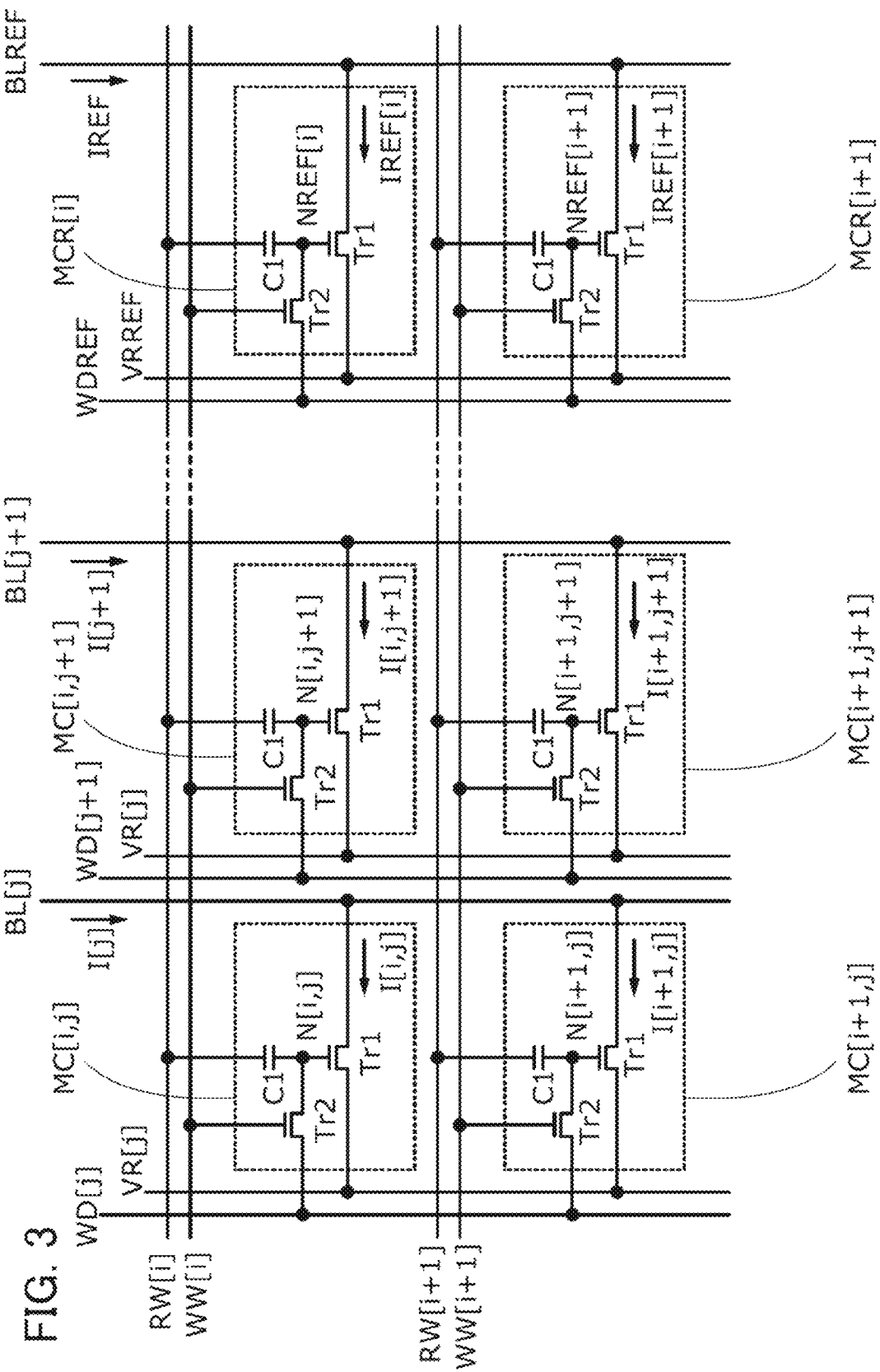
FIG. 3 illustrates a specific circuit configuration of a memory cell MC and a memory cell MCR and a specific connection relationship between them.

FIG. 3 illustrates, as an example, a specific circuit configuration and a specific connection relationship of the memory cells MC in any two rows and two columns among the memory cells MC illustrated in FIG. 2 and the memory cells MCR in any two rows and one column among the memory cells MCR illustrated in FIG. 2.

Specifically, FIG. 3 illustrates the memory cell MC[i, j] in the i-th row and the j-th column, the memory cell MC[i+1, j] in the i+1-th row and the j-th column, a memory cell MC[i, j+1] in the i-th row and the j+1-th column, and a memory cell MC[i+1, j+1] in the i+1-th row and the j+1-th column. FIG. 3 also illustrates the memory cell MCR[i] in the i-th row and the memory cell MCR[i+1] in the i+1-th row. Note that i is any number from 1 to y, and j is any number from 1 to x.

The memory cell MC[i, j], the memory cell MC[i, j+1], and the memory cell MCR[i] in the i-th row are electrically connected to the wiring RW[i] and a wiring WW[i]. The memory cell MC[j+1, j], the memory cell MC[i+1, j+1], and the memory cell MCR[i+1] in the i+1-th row are electrically connected to the wiring RW[i+1] and a wiring WW[i+1].

The memory cell MC[i, j] and the memory cell MC[i+1, j] in the j-th column are electrically connected to the wiring WD[j], the wiring VR[j], and the wiring BL[j]. The memory cell MC[i, j+1] and the memory cell MC[i+1, j+1] in the j+1-th column are electrically connected to a wiring WD[j+1], a wiring VR[j+1], and a wiring BL[j+1]. The memory cell MCR[i] in the i-th row and the memory cell MCR[i+1] in the i+1-th row are electrically connected to the wiring WDREF, the wiring VRREF, and the wiring BLREF.

The memory cells MC and MCR each include the transistor Tr1, a transistor Tr2, and a capacitor C1. The transistor Tr2 has a function of controlling the input of the first analog potential to the memory cell MC or the memory cell MCR.

The transistor Tr1 has a function of generating analog current in accordance with a potential input to its gate. The capacitor C1 has a function of adding the second analog potential or a potential corresponding to the second analog potential to the first analog potential or a potential corresponding to the first analog potential that is held in the memory cell MC or the memory cell MCR.

Specifically, in the memory cell MC illustrated in FIG. 3, a gate of the transistor Tr2 is electrically connected to the wiring WW, one of a source and a drain of the transistor Tr2 is electrically connected to the wiring WD, and the other of the source and the drain of the transistor Tr2 is electrically connected to the gate of the transistor Tr1. Furthermore, one of a source and a drain of the transistor Tr1 is electrically connected to the wiring VR, and the other of the source and the drain of the transistor Tr1 is electrically connected to the wiring BL. A first electrode of the capacitor C1 is electrically connected to the wiring RW, and a second electrode of the capacitor C1 is electrically connected to the gate of the transistor Tr1.

In addition, in the memory cell MCR illustrated in FIG. 3, a gate of the transistor Tr2 is electrically connected to the wiring WW, one of a source and a drain of the transistor Tr2 is electrically connected to the wiring WDREF, and the other of the source and the drain of the transistor Tr2 is electrically connected to the gate of the transistor Tr1. Furthermore, one of a source and a drain of the transistor Tr1 is electrically connected to the wiring VRREF, and the other of the source and the drain of the transistor Tr1 is electrically connected to the wiring BLREF. A first electrode of the capacitor C1 is electrically connected to the wiring RW, and a second electrode of the capacitor C1 is electrically connected to the gate of the transistor Tr1.

The gate of the transistor Tr1 in the memory cell MC is called a node N here. In the memory cell MC, the first analog potential or a potential corresponding to the first analog potential is input to the node N through the transistor Tr2. Then, when the transistor Tr2 is turned off, the node N is brought into a floating state and the first analog potential or the potential corresponding to the first analog potential is held at the node N. In the memory cell MC, when the node N is brought into a floating state, the second analog potential or a potential corresponding to the second analog potential input to the first electrode of the capacitor C1 is applied to the node N. As a result of the above operation, the node N can have a potential obtained by adding the second analog potential or the potential corresponding to the second analog potential to the first analog potential or the potential corresponding to the first analog potential.

Because the potential of the first electrode of the capacitor C1 is applied to the node N through the capacitor C1, the amount of change in the potential of the first electrode is not exactly the same as the amount of change in the potential of the node N, actually. Specifically, the accurate amount of change in the potential of the node N can be calculated in the following manner: a coupling coefficient uniquely determined by the capacitance value of the capacitor C1, the value of the gate capacitance of the transistor Tr1, and the value of parasitic capacitance is multiplied by the amount of change in the potential of the first electrode. In the following description, the amount of change in the potential of the first electrode is assumed to be substantially the same as the amount of change in the potential of the node N, for easy understanding.

The drain current of the transistor Tr1 is determined in accordance with the potential of the node N. Thus, when the transistor Tr2 is turned off, the value of the drain current of the transistor Tr1 as well as the potential of the node N is held. The drain current is affected by the first analog potential and the second analog potential.

The gate of the transistor Tr1 in the memory cell MCR is called a node NREF here. In the memory cell MCR, the first reference potential or a potential corresponding to the first reference potential is input to the node NREF through the transistor Tr2. Then, when the transistor Tr2 is turned off, the node NREF is brought into a floating state and the first reference potential or the potential corresponding to the first reference potential is held at the node NREF. In the memory cell MCR, when the node NREF is brought into a floating state, the second analog potential or a potential corresponding to the second analog potential input to the first electrode of the capacitor C1 is applied to the node NREF. As a result of the above operation, the node NREF can have a potential obtained by adding the second analog potential or the potential corresponding to the second analog potential to the first reference potential or the potential corresponding to the first reference potential.

The drain current of the transistor Tr1 is determined in accordance with the potential of the node NREF. Thus, when the transistor Tr2 is turned off, the value the drain current of the transistor Tr1 as well as the potential of the node NREF is held. The drain current is affected by the first reference potential and the second analog potential.

When the drain current of the transistor Tr1 in the memory cell MC[i, j] is the current I[i, j] and the drain current of the transistor Tr1 in the memory cell MC[i+1, j] is the current I[i+1, j], the sum of currents supplied to the memory cell MC[i, j] and the memory cell MC[i+1, j] through the wiring BL[j] is the current I[j]. When the drain current of the transistor Tr1 in the memory cell MC[i, j+1] is a current I[i, j+1] and the drain current of the transistor Tr1 in the memory cell MC[i+1, j+1] is a current I[i+1, j+1], the sum of currents supplied to the memory cell MC[i, j+1] and the memory cell MC[i+1, j+1] through the wiring BLU+11 is a current I[j+1]. When the drain current of the transistor Tr1 in the memory cell MCR[i] is the current IREF[i] and the drain current of the transistor Tr1 in the memory cell MCR[i+1] is the current IREF[i+1], the sum of currents supplied to the memory cell MCR[i] and the memory cell MCR[i+1] through the wiring BLREF is the current IREF.

Then, a specific configuration example of the circuit 13, the circuit 14, and the current supply circuit 15 (CREF) will be described with reference to FIG. 4.

Figure 4:
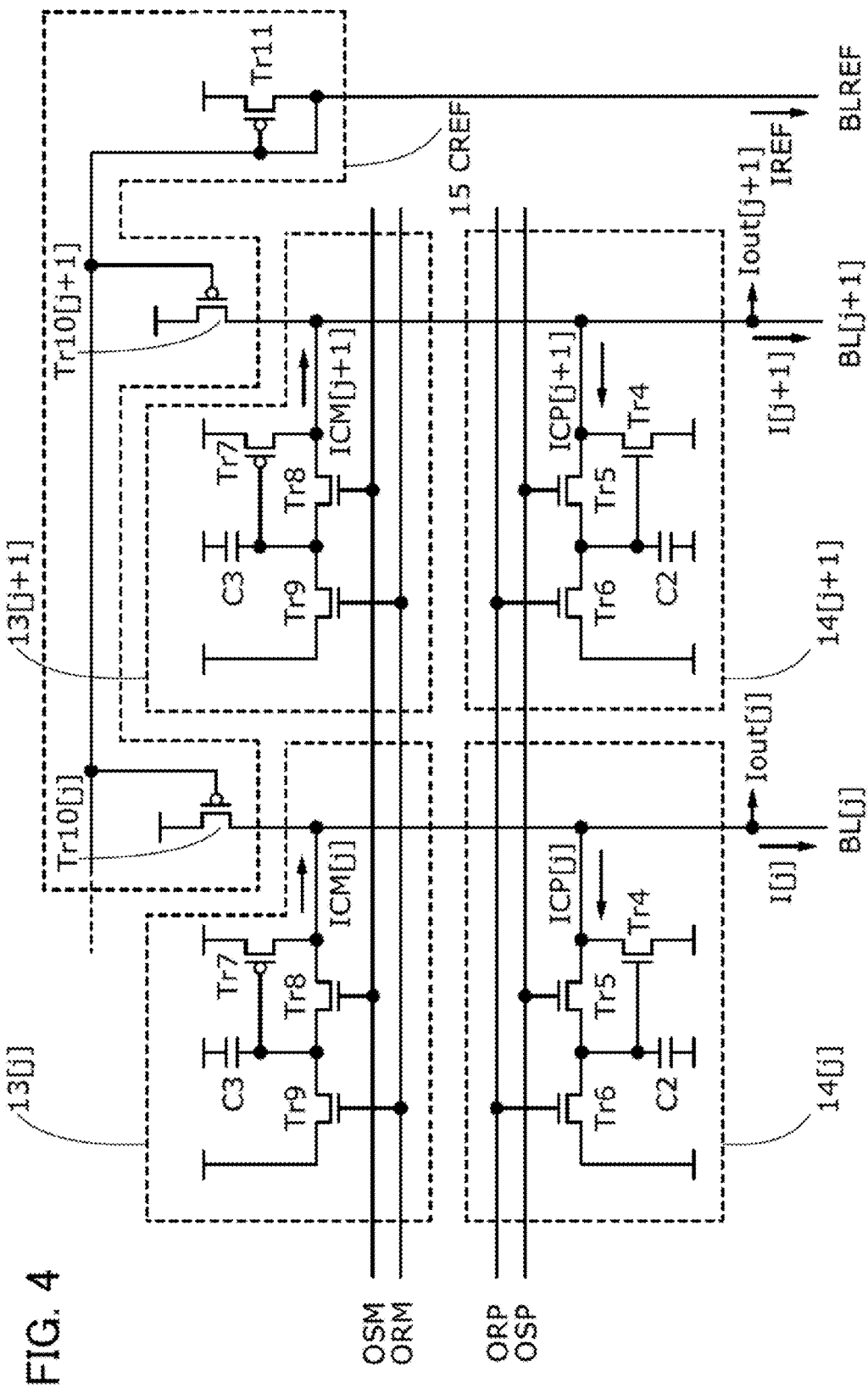
FIG. 4 illustrates a specific configuration of a circuit 13, a circuit 14, and a current supply circuit.

FIG. 4 illustrates a configuration example of the circuit 13, the circuit 14, and the current supply circuit 15 for the memory cell MC and the memory cell MCR illustrated in FIG. 3. Specifically, FIG. 4 illustrates a circuit 13[*j*] for the memory cells MC in the j-th column and a circuit 13[*j*+1] for the memory cells MC in the j+1-th column, as the circuit 13. FIG. 4 illustrates a circuit 14[*j*] for the memory cells MC in the j-th column and a circuit 14[*j*+1] for the memory cells MC in the j+1-th column, as the circuit 14.

The circuit 13[*j*] and the circuit 14[*j*] are electrically connected to the wiring BL[j]. The circuit 13[*j*+1] and the circuit 14[*j*+1] are electrically connected to the wiring BL[j+1].

The current supply circuit 15 is electrically connected to the wiring BL[j], the wiring BL[j+1], and the wiring BLREF. The current supply circuit 15 has a function of supplying the current IREF to the wiring BLREF and a function of supplying current that is the same as the current IREF or current that corresponds to the current IREF to each of the wiring BL[j] and the wiring BL[j+1].

Specifically, the circuit 13[*j*] and the circuit 13[*j*+1] each include a transistor Tr7, a transistor Tr8, a transistor Tr9, and a capacitor C3. The transistor Tr7 in the circuit 13[*j*] has a function of generating the current ICM[j] that corresponds to the difference between the current I[j] and the current IREF, when the current I[j] is higher than the current IREF and offset current is set. Furthermore, the transistor Tr7 in the circuit 13[*j*+1] has a function of generating a current ICM [j+1] that corresponds to the difference between the current I[j+1] and the current IREF, when the current I[j+1] is higher than the current IREF. The current ICM[j] and the current ICM[j+1] are supplied from the circuit 13[*j*] and the circuit 13[*j*+1] to the wiring BL[j] and the wiring BL[j+1], respectively.

In each of the circuit 13[*j*] and the circuit 13[*j*+1], one of a source and a drain of the transistor Tr7 is electrically connected to the corresponding wiring BL, and the other of the source and the drain is electrically connected to a wiring through which a predetermined potential is supplied. One of a source and a drain of the transistor Tr8 is electrically connected to the corresponding wiring BL, and the other of the source and the drain is electrically connected to a gate of the transistor Tr7. One of a source and a drain of the transistor Tr9 is electrically connected to the gate of the transistor Tr7, and the other of the source and the drain is electrically connected to a wiring through which a predetermined potential is supplied. A first electrode of the capacitor C3 is electrically connected to the gate of the transistor Tr7, and a second electrode of the capacitor C3 is electrically connected to a wiring through which a predetermined potential is supplied.

A gate of the transistor Tr8 is electrically connected to a wiring OSM, and a gate of the transistor Tr9 is electrically connected to a wiring ORM.

Note that FIG. 4 illustrates an example where the transistor Tr7 is a p-channel transistor and the transistors Tr8 and Tr9 are n-channel transistors.

The circuit 14[*j*] and the circuit 14[*j*+1] each include a transistor Tr4, a transistor Tr5, a transistor Tr6, and a capacitor C2. The transistor Tr4 in the circuit 14[*j*] has a function of generating the current ICP[j] that corresponds to the difference between the current IREF and the current I[j], when the current I[j] is lower than the current IREF and offset current is set. Furthermore, the transistor Tr4 in the circuit 14[*j*+1] has a function of generating a current ICP [j+1] that corresponds to the difference between the current IREF and the current I[j+1], when the current I[j+1] is lower than the current IREF. The current ICP[j] and the current ICP[j+1] are drawn from the wiring BL[j] and the wiring BL[j+1] into the circuit 14[*j*] and the circuit 14[j+1], respectively.

Note that the current ICM[j] and the current ICP[j] each correspond to the current Ioffset[j], and the current ICM[j+1] and the current ICP[j+1] each correspond to a current Ioffset[j+1].

In each of the circuit 14[*j*] and the circuit 14[*j*+1], one of a source and a drain of the transistor Tr4 is electrically connected to the corresponding wiring BL, and the other of the source and the drain is electrically connected to a wiring through which a predetermined potential is supplied. One of a source and a drain of the transistor Tr5 is electrically connected to the corresponding wiring BL, and the other of the source and the drain is electrically connected to a gate of the transistor Tr4. One of a source and a drain of the transistor Tr6 is electrically connected to the gate of the transistor Tr4, and the other of the source and the drain is electrically connected to a wiring through which a predetermined potential is supplied. A first electrode of the capacitor C2 is electrically connected to the gate of the transistor Tr4, and a second electrode of the capacitor C2 is electrically connected to a wiring through which a predetermined potential is supplied.

A gate of the transistor Tr5 is electrically connected to a wiring OSP, and a gate of the transistor Tr6 is electrically connected to a wiring ORP.

Note that FIG. 4 illustrates an example where the transistors Tr4 to Tr6 are n-channel transistors.

The current supply circuit 15 includes a transistor Tr10 for the wiring BL and a transistor Tr11 for the wiring BLREF. Specifically, FIG. 4 illustrates an example where the current supply circuit 15 includes, as the transistor Tr10, a transistor Tr10[j] for the wiring BL[j] and a transistor Tr10[j+1] for the wiring BL[j+1].

A gate of the transistor Tr10 is electrically connected to a gate of the transistor Tr11. One of a source and a drain of the transistor Tr10 is electrically connected to the corresponding wiring BL, and the other of the source and the drain is electrically connected to a wiring through which a predetermined potential is supplied. One of a source and a drain of the transistor Tr11 is electrically connected to the wiring BLREF, and the other of the source and the drain is electrically connected to a wiring through which a predetermined potential is supplied.

The transistors Tr10 and Tr11 have the same polarity. FIG. 4 illustrates an example where the transistors Tr10 and Tr11 are p-channel transistors.

The drain current of the transistor Tr11 corresponds to the current IREF. The transistor Tr10 and the transistor Tr11 collectively function as a current mirror circuit; thus, the drain current of the transistor Tr10 is substantially the same as the drain current of the transistor Tr11 or corresponds to the drain current of the transistor Tr11.

Note that in FIG. 4, a switch may be provided between the circuit 13[j] and the circuit 14[j] or between the circuit 13[j+1] and the circuit 14[j+1]. Alternatively, a switch may be provided between the reference memory circuit 12 and the transistor Tr11 included in the current supply circuit 15.

Figure 6:
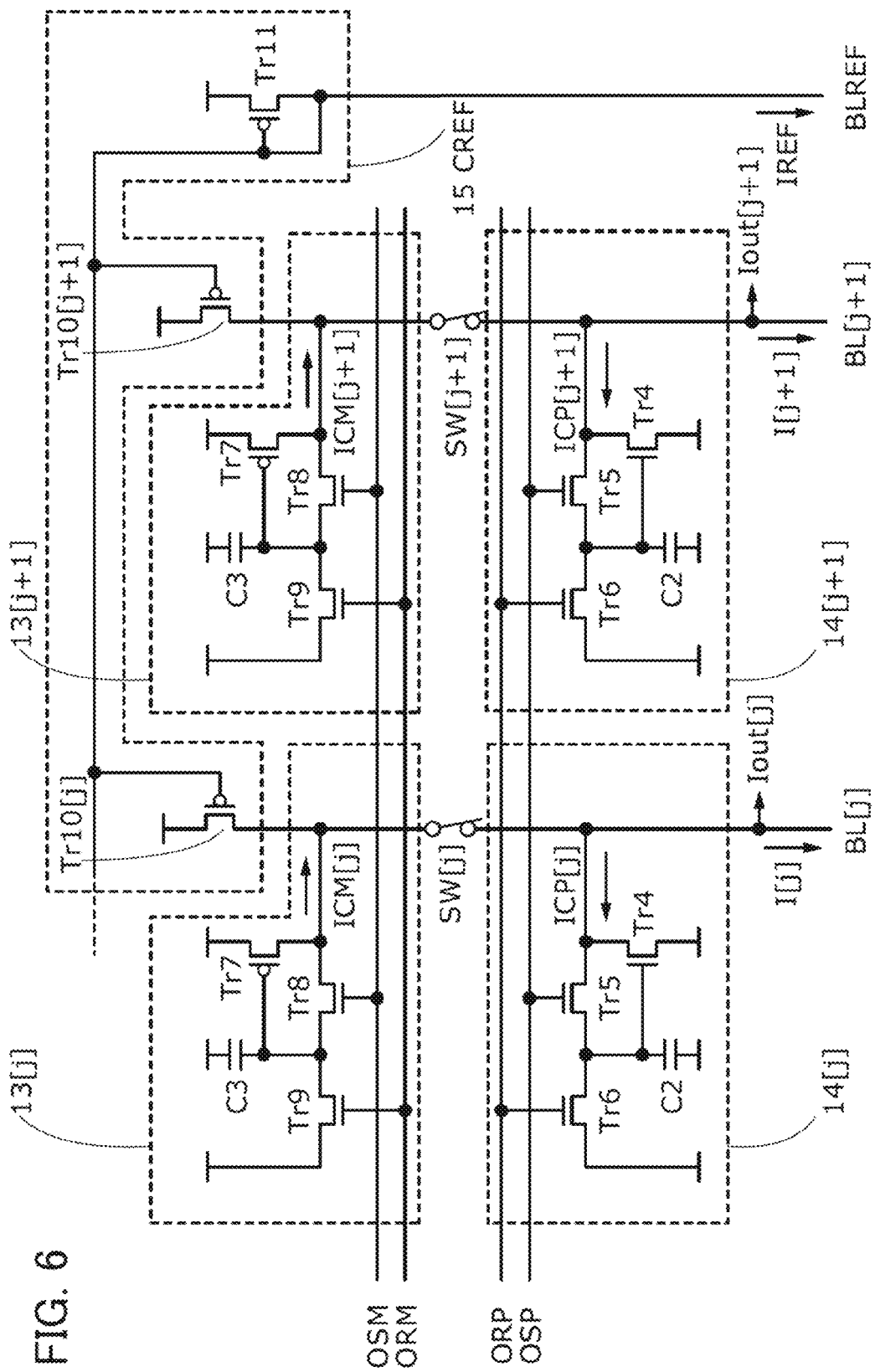
FIG. 6 illustrates a specific connection relationship between the circuit 13, the circuit 14, a current supply circuit, and a switch.

FIG. 6 illustrates an example of a connection relationship between the circuit 13[j], the circuit 14[j], a switch SW[j] controlling the electrical connection between the circuit 13[j] and the circuit 14[j], and the current supply circuit 15. FIG. 6 also illustrates an example of a connection relationship between the circuit 13[j+1], the circuit 14[j+1], a switch SW[j+1] controlling the electrical connection between the circuit 13[j+1] and the circuit 14[j+1], and the current supply circuit 15.

Specifically, the switch SW[j] has a function of controlling the electrical connection between one of the source and the drain of the transistor Tr7 in the circuit 13[j] and one of the source and the drain of the transistor Tr4 in the circuit 14[j]. The switch SW[j+1] has a function of controlling the electrical connection between one of the source and the drain of the transistor Tr7 in the circuit 13[j+1] and one of the source and the drain of the transistor Tr4 in the circuit 14[j+1].

The switch SW[j] can prevent current from flowing between the current supply circuit 15 or the circuit 13[j] and the circuit 14[j] or the memory circuit 11 in writing of the first analog potential to the memory cell MC. Furthermore, the switch SW[j+1] can prevent current from flowing between the current supply circuit 15 or the circuit 13[j+1] and the circuit 14[j+1] or the memory circuit 11 in writing of the first analog potential to the memory cell MC.

Next, a specific operation example of the semiconductor device 10 of one embodiment of the present invention will be described with reference to FIG. 3, FIG. 4, and FIG. 5.

Figure 5:
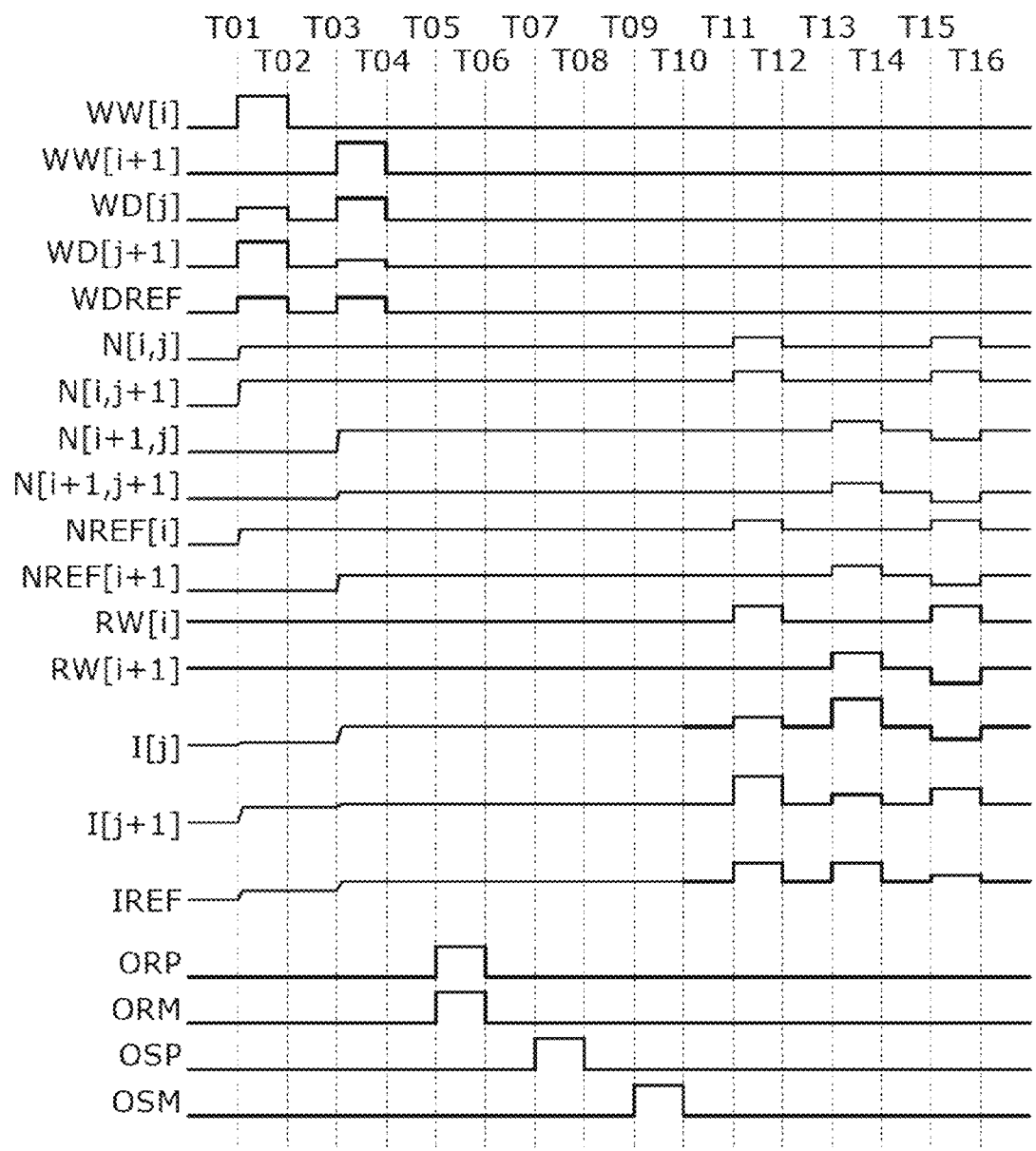
FIG. 5 is a timing chart.

FIG. 5 is an example of a timing chart showing the operations of the memory cell MC and the memory cell MCR illustrated in FIG. 3 and the circuit 13, the circuit 14, and the current supply circuit 15 illustrated in FIG. 4. From Time T01 to Time T04 in FIG. 5, the first analog data is stored in the memory cell MC and the memory cell MCR. From Time T05 to Time T10, the value of the offset current Ioffset that is supplied from the circuit 13 and the circuit 14 is set. From Time T11 to Time T16, data corresponding to the product-sum of the first analog data and the second analog data is acquired.

Note that a low-level potential is supplied to the wiring VR[j] and the wiring VR[j+1]. The high-level potential VDD is supplied to all wirings having a predetermined potential that are electrically connected to the circuit 13. The low-level potential VSS is supplied to all wirings having a predetermined potential that are electrically connected to the circuit 14. Furthermore, the high-level potential VDD is supplied to all wirings having a predetermined potential that are electrically connected to the current supply circuit 15.

The transistors Tr1, Tr4, Tr7, Tr10[j], Tr10[j+1], and Tr11 each operate in a saturation region.

First, a high-level potential is applied to the wiring WW[i] and a low-level potential is applied to the wiring WW[i+1] from Time T01 to Time T02. Accordingly, the transistors Tr2 in the memory cell MC[i, j], the memory cell MC[i, j+1], and the memory cell MCR[i] illustrated in FIG. 3 are turned on. The transistors Tr2 in the memory cell MC[i+1, j], the memory cell MC[i+1, j+1], and the memory cell MCR[i+1] remain off.

In addition, from Time T01 to Time T02, a potential obtained by subtracting the first analog potential from the first reference potential VPR is applied to each of the wiring WD[j] and the wiring WD[j+1] illustrated in FIG. 3. Specifically, the potential VPR−Vx[i, j] is applied to the wiring WD[j], and a potential VPR−Vx[i, j+1] is applied to the wiring WD[j+1]. The first reference potential VPR is applied to the wiring WDREF, and a potential between the potential VSS and the potential VDD, e.g., a potential (VDD+VSS)/2, is applied as a base potential to the wiring RW[i] and the wiring RW[i+1].

Accordingly, the potential VPR−Vx[i, j] is applied to a node N[i, j] through the transistor Tr2 in the memory cell MC[i, j] illustrated in FIG. 3, the potential VPR−Vx[i, j+1] is applied to a node N[i, j+1] through the transistor Tr2 in the memory cell MC[i, j+1], and the first reference potential VPR is applied to a node NREF[i] through the transistor Tr2 in the memory cell MCR[i].

After Time T02, the potential applied to the wiring WW[i] illustrated in FIG. 3 changes from a high-level potential to a low-level potential, so that the transistors Tr2 in the memory cell MC[i, j], the memory cell MC[i, j+1], and the memory cell MCR[i] are turned off. Accordingly, the potential VPR−Vx[i, j] is held at the node N[i, j], the potential VPR−Vx[i, j+1] is held at the node N[i, j+1], and the first reference potential VPR is held at the node NREF[i].

Then, from Time T03 to Time T04, the potential of the wiring WW[i] illustrated in FIG. 3 remains at a low level and a high-level potential is applied to the wiring WW[i+1].

Accordingly, the transistors Tr2 in the memory cell MC[i+1, j], the memory cell MC[i+1, j+1], and the memory cell MCR[i+1] illustrated in FIG. 3 are turned on. The transistors Tr2 in the memory cell MC[i, j], the memory cell MC[i, j+1], and the memory cell MCR[i] remain off.

In addition, from Time T03 to Time T04, a potential obtained by subtracting the first analog potential from the first reference potential VPR is applied to each of the wiring WD[j] and the wiring WD[j+1] illustrated in FIG. 3. Specifically, the potential VPR−Vx[i+1, j] is applied to the wiring WD[j], and a potential VPR−Vx[i+1, j+1] is applied to the wiring WD[j+1]. The first reference potential VPR is applied to the wiring WDREF, and a potential between the potential VSS and the potential VDD, e.g., the potential (VDD+VSS)/2, is applied as a base potential to the wiring RW[i] and the wiring RW[i+1].

Accordingly, the potential VPR−Vx[i+1, j] is applied to a node N[i+1, j] through the transistor Tr2 in the memory cell MC[i+1, j] illustrated in FIG. 3, the potential VPR−Vx[i+1, j+1] is applied to a node N[i+1, j+1] through the transistor Tr2 in the memory cell MC[i+1, j+1], and the first reference potential VPR is applied to a node NREF[i+1] through the transistor Tr2 in the memory cell MCR[i+1].

After Time T04, the potential applied to the wiring WW[i+1] illustrated in FIG. 3 changes from a high-level potential to a low-level potential, so that the transistors Tr2 in the memory cell MC[i+1, j], the memory cell MC[i+1, j+1], and the memory cell MCR[i+1] are turned off. Accordingly, the potential VPR−Vx[i+1, j] is held at the node N[i+1, j], the potential VPR−Vx[i+1, j+1] is held at the node N[i+1, j+1], and the first reference potential VPR is held at the node NREF[i+1].

Next, a high-level potential is applied to the wiring ORP and the wiring ORM illustrated in FIG. 4 from Time T05 to Time T06. When a high-level potential is applied to the wiring ORM, the transistors Tr9 in the circuit 13[j] and the circuit 13[j+1] illustrated in FIG. 4 are turned on, so that the gates of the transistors Tr7 are reset by the potential VDD applied thereto.

Furthermore, when a high-level potential is applied to the wiring ORP, the transistors Tr6 in the circuit 14[j] and the circuit 14[j+1] illustrated in FIG. 4 are turned on, so that the gates of the transistors Tr4 are reset by the potential VSS applied thereto.

After Time T06, the potential applied to the wiring ORP and the wiring ORM illustrated in FIG. 4 changes from a high-level potential to a low-level potential, so that the transistors Tr9 in the circuit 13[j] and the circuit 13[j+1] and the transistors Tr6 in the circuit 14[j] and the circuit 14[j+1] are turned off. Accordingly, the potential VDD is held at the gate of the transistor Tr7 in each of the circuit 13[j] and the circuit 13[j+1], and the potential VSS is held at the gate of the transistor Tr4 in each of the circuit 14[j] and the circuit 14[j+1].

From Time T07 to Time T08, a high-level potential is applied to the wiring OSP illustrated in FIG. 4. Furthermore, a potential between the potential VSS and the potential VDD, e.g., the potential (VDD+VSS)/2, is applied as a base potential to the wiring RW[i] and the wiring RW[i+1] illustrated in FIG. 3. Since a high-level potential is applied to the wiring OSP, the transistors Tr5 in the circuit 14[j] and the circuit 14[j+1] are turned on.

If the current I[j] flowing through the wiring BL[j] is lower than the current IREF flowing through the wiring BLREF, that is, if the current ΔI[j] has a positive value, it means that the sum of current that can be drawn by the transistor Tr1 in the memory cell MC[i, j] illustrated in FIG. 3 and current that can be drawn by the transistor Tr1 in the memory cell MC[i+1, j] is smaller than the value of the drain current of the transistor Tr10[j]. Thus, if the current ΔI[j] has a positive value, part of the drain current of the transistor Tr10[j] flows to the gate of the transistor Tr4 when the transistor Tr5 is turned on in the circuit 14[j], and the potential of the gate starts to rise. When the drain current of the transistor Tr4 becomes substantially equal to the current ΔI[j], the potential of the gate of the transistor Tr4 converges on a certain value. The potential of the gate of the transistor Tr4 at this time corresponds to a potential at which the drain current of the transistor Tr4 becomes the current ΔI[j], i.e., the current Ioffset[j] (=ICP[j]). This means that the transistor Tr4 in the circuit 14[j] is in a state of serving as a current source that can supply the current ICP[j].

Similarly, if the current I[j+1] flowing through the wiring BL[j+1] is lower than the current IREF flowing through the wiring BLREF, that is, if a current ΔI[j+1] has a positive value, part of the drain current of the transistor Tr10[j+1] flows to the gate of the transistor Tr4 when the transistor Tr5 is turned on in the circuit 14[j+1], and the potential of the gate starts to rise. When the drain current of the transistor Tr4 becomes substantially equal to the current ΔI[j+1], the potential of the gate of the transistor Tr4 converges on a certain value. The potential of the gate of the transistor Tr4 at this time corresponds to a potential at which the drain current of the transistor Tr4 becomes the current ΔI[j+1], i.e., the current Ioffset[j+1] (=ICP[j+1]). This means that the transistor Tr4 in the circuit 14[j+1] is in a state of serving as a current source that can supply the current ICP[j+1].

After Time T08, the potential applied to the wiring OSP illustrated in FIG. 4 changes from a high-level potential to a low-level potential, so that the transistors Tr5 in the circuit 14[j] and the circuit 14[j+1] are turned off. Accordingly, the potentials of the gates of the transistors Tr4 are held. Thus, the circuit 14[j] remains in a state of serving as the current source that can supply the current ICP[j], and the circuit 14[j+1] remains in a state of serving as the current source that can supply the current ICP[j+1].

From Time T09 to Time T10, a high-level potential is applied to the wiring OSM illustrated in FIG. 4. Furthermore, a potential between the potential VSS and the potential VDD, e.g., the potential (VDD+VSS)/2, is applied as a base potential to each of the wiring RW[i] and the wiring RW[i+1] illustrated in FIG. 3. Since a high-level potential is applied to the wiring OSM, the transistors Tr8 in the circuit 13[j] and the circuit 13[j+1] are turned on.

If the current I[j] flowing through the wiring BL[j] is higher than the current IREF flowing through the wiring BLREF, that is, if the current ΔI[j] has a negative value, it means that the sum of current that can be drawn by the transistor Tr1 in the memory cell MC[i, j] illustrated in FIG. 3 and current that can be drawn by the transistor Tr1 in the memory cell MC[i+1, j] is larger than the value of the drain current of the transistor Tr10[j]. Thus, if the current ΔI[j] has a negative value, current flows from the gate of the transistor Tr7 to the wiring BL[j] when the transistor Tr8 is turned on in the circuit 13[j], and the potential of the gate starts to decrease. When the drain current of the transistor Tr7 becomes substantially equal to the current ΔI[j], the potential of the gate of the transistor Tr7 converges on a certain value. The potential of the gate of the transistor Tr7 at this time corresponds to a potential at which the drain current of the transistor Tr7 becomes the current ΔI[j], i.e., the current Ioffset[j] (=ICM[j]). This means that the transistor Tr7 in the circuit 13[j] is in a state of serving as a current source that can supply the current ICM[j].

Similarly, if the current I[j+1] flowing through the wiring BL[j+1] is higher than the current IREF flowing through the wiring BLREF, that is, if the current ΔI[j+1] has a negative value, current flows from the gate of the transistor Tr7 in the circuit 13[j+1] to the wiring BL[j+1] when the transistor Tr8 is turned on, and the potential of the gate starts to decrease. When the drain current of the transistor Tr7 becomes substantially equal to the absolute value of the current ΔI[j+1], the potential of the gate of the transistor Tr7 converges on a certain value. The potential of the gate of the transistor Tr7 at this time corresponds to a potential at which the drain current of the transistor Tr7 becomes equal to the absolute value of the current ΔI[j+1], i.e., the current Ioffset[j+1] (=ICM[j+1]). This means that the transistor Tr7 in the circuit 13[j+1] is in a state of serving as a current source that can supply the current ICM[j+1].

After Time T10, the potential applied to the wiring OSM illustrated in FIG. 4 changes from a high-level potential to a low-level potential, so that the transistors Tr8 in the circuit 13[j] and the circuit 13[j+1] are turned off. Accordingly, the potentials of the gates of the transistors Tr7 are held. Thus, the circuit 13[j] remains in a state of serving as the current source that can supply the current ICM[j], and the circuit 13[j+1] remains in a state of serving as the current source that can supply the current ICM[j+1].

In each of the circuit 14[j] and the circuit 14[j+1], the transistor Tr4 has a function of drawing current. Thus, from Time T07 to Time T08, when the current I[j] flowing through the wiring BL[j] is higher than the current IREF flowing through the wiring BLREF and the current ΔI[j] has a negative value, or when the current I[j+1] flowing through the wiring BL[j+1] is higher than the current IREF flowing through the wiring BLREF and the current ΔI[j+1] has a negative value, it might be difficult to supply current from the circuit 14[j] or the circuit 14[j+1] to the wiring BL[j] or the wiring BL[j+1] without excess or deficiency. In that case, it might be difficult for the transistor Tr1 in the memory cell MC, the transistor Tr4 in the circuit 14[j] or the circuit 14[j+1], and the transistor Tr10[j] or Tr10[j+1] to concurrently operate in a saturation region because a balance between the current flowing through the wiring BLREF and the current flowing through the wiring BL[j] or the wiring BL[j+1] is struck.

To ensure the operations of the transistor Tr1, the transistor Tr4, and the transistor Tr10[j] or Tr10[j+1] in a saturation region from Time T07 to Time T08 even when the current ΔI[j] has a negative value, the potential of the gate of the transistor Tr7 may be set to a potential that is high enough to obtain a predetermined drain current, instead of resetting the potential of the gate of the transistor Tr7 to the potential VDD, from Time T05 to Time T06. In the above configuration, the amount of current that cannot be drawn by the transistor Tr1 can be drawn by the transistor Tr4 to some extent because current from the transistor Tr7, as well as the drain current of the transistor Tr10[j] or Tr10[j+1], is supplied; thus, the operations of the transistor Tr1, the transistor Tr4, and the transistor Tr10[j] or Tr10[j+1] in a saturation region can be ensured.

Note that if the current I[j] flowing through the wiring BL[j] is lower than the current IREF flowing through the wiring BLREF, that is, if the current ΔI[j] has a positive value, from Time T09 to Time T10, since the circuit 14[j] has been set as the current source that can supply the current ICP[j] from Time T07 to Time T08, the potential of the gate of the transistor Tr7 in the circuit 13[j] keeps a value substantially the same as that of the potential VDD. Similarly, if the current I[j+1] flowing through the wiring BL[j+1] is lower than the current IREF flowing through the wiring BLREF, that is, if the current ΔI[j+1] has a positive value, since the circuit 14[j+1] has been set as the current source that can supply the current ICP[j+1] from Time T07 to Time T08, the potential of the gate of the transistor Tr7 in the circuit 13[j+1] keeps a value substantially the same as that of the potential VDD.

Then, from Time T11 to Time T12, the second analog potential Vw[i] is applied to the wiring RW[i] illustrated in FIG. 3. Furthermore, a potential between the potential VSS and the potential VDD, e.g., the potential (VDD+VSS)/2, is still applied as a base potential to the wiring RW[i+1]. In practice, the potential of the wiring RW[i] is a potential higher than the potential between the potential VSS and the potential VDD (e.g., the potential (VDD+VSS)/2), which is a base potential, by Vw[i]; for the simplicity of the following description, however, the potential of the wiring RW[i] is assumed to be the second analog potential Vw[i].

When the potential of the wiring RW[i] becomes the second analog potential Vw[i], with the assumption that the amount of change in the potential of the first electrode of the capacitor C1 is substantially the same as the amount of change in the potential of the node N, the potential of the node N in the memory cell MC[i, j] illustrated in FIG. 3 becomes VPR−Vx[i, j]+Vw[i] and the potential of the node N in the memory cell MC[i, j+1] becomes VPR−Vx[i, j+1]+Vw[i]. According to Formula 6, the product-sum of the first analog data and the second analog data for the memory cell MC[i, j] affects current obtained by subtracting the current Ioffset[j] from the current ΔI[j], that is, the current Iout[j] flowing from the wiring BL[j]. Furthermore, the product-sum of the first analog data and the second analog data for the memory cell MC[i, j+1] affects current obtained by subtracting the current Ioffset[j+1] from the current ΔI[j+1], that is, a current Iout[j+1] flowing from the wiring BL[j+1].

After Time T12, a potential between the potential VSS and the potential VDD (e.g., the potential (VDD+VSS)/2), which is a base potential, is applied again to the wiring RW[i].

Then, from Time T13 to Time T14, the second analog potential Vw[i+1] is applied to the wiring RW[i+1] illustrated in FIG. 3. Furthermore, a potential between the potential VSS and the potential VDD, e.g., the potential (VDD+VSS)/2, is still applied as a base potential to the wiring RW[i]. In practice, the potential of the wiring RW[i+1] is a potential higher than the potential between the potential VSS and the potential VDD (e.g., the potential (VDD+VSS)/2), which is a base potential, by Vw[i+1]; for the simplicity of the following description, however, the potential of the wiring RW[i+1] is assumed to be the second analog potential Vw[i+1].

When the potential of the wiring RW[i+1] becomes the second analog potential Vw[i+1], with the assumption that the amount of change in the potential of the first electrode of the capacitor C1 is substantially the same as the amount of change in the potential of the node N, the potential of the node N in the memory cell MC[i+1, j] illustrated in FIG. 3 becomes VPR−Vx[i+1, j]+Vw[i+1] and the potential of the node N in the memory cell MC[i+1, j+1] becomes VPR−Vx[i+1, j+1]+Vw[i+1]. According to Formula 6, the product-sum of the first analog data and the second analog data for the memory cell MC[i+1, j] affects current obtained by subtracting the current Ioffset[j] from the current ΔI[j], that is, the current Iout[j]. Furthermore, the product-sum of the first analog data and the second analog data for the memory cell MC[i+1, j+1] affects current obtained by subtracting the current Ioffset[j+1] from the current ΔI[j+1], that is, a current Iout[j+1].

After Time T14, a potential between the potential VSS and the potential VDD (e.g., the potential (VDD+VSS)/2), which is a base potential, is applied again to the wiring RW[i+1].

Then, from Time T15 to Time T16, the second analog potential Vw[i] is applied to the wiring RW[i] illustrated in FIG. 3 and the second analog potential Vw[i+1] is applied to the wiring RW[i+1]. In practice, the potential of the wiring RW[i] is a potential higher than the potential between the potential VSS and the potential VDD (e.g., the potential (VDD+VSS)/2), which is a base potential, by Vw[i], and the potential of the wiring RW[i+1] is a potential higher than the potential between the potential VSS and the potential VDD (e.g., the potential (VDD+VSS)/2), which is a base potential, by Vw[i+1]; for the simplicity of the following description, however, the potential of the wiring RW[i] is assumed to be the second analog potential Vw[i] and the potential of the wiring RW[i+1] is assumed to be the second analog potential Vw[i+1].

When the potential of the wiring RW[i] becomes the second analog potential Vw[i], with the assumption that the amount of change in the potential of the first electrode of the capacitor C1 is substantially the same as the amount of change in the potential of the node N, the potential of the node N in the memory cell MC[i, j] illustrated in FIG. 3 becomes VPR−Vx[i, j]+Vw[i] and the potential of the node N in the memory cell MC[i, j+1] becomes VPR−Vx[i, j+1]+Vw[i]. Furthermore, when the potential of the wiring RW[i+1] becomes the second analog potential Vw[i+1], with the assumption that the amount of change in the potential of the first electrode of the capacitor C1 is substantially the same as the amount of change in the potential of the node N, the potential of the node N in the memory cell MC[i+1, j] illustrated in FIG. 3 becomes VPR−Vx[i+1, j]+Vw[i+1] and the potential of the node N in the memory cell MC[i+1, j+1] becomes VPR−Vx[i+1, j+1]+Vw[i+1].

According to Formula 6, the product-sum of the first analog data and the second analog data for the memory cell MC[i, j] and the memory cell MC[i+1, j] affects current obtained by subtracting the current Ioffset[j] from the current ΔI[j], that is, the current Iout[j]. Furthermore, the product-sum of the first analog data and the second analog data for the memory cell MC[i, j+1] and the memory cell MC[i+1, j+1] affects current obtained by subtracting the current Ioffset[j+1] from the current ΔI[j+1], that is, a current Iout[j+1].

After Time T16, a potential between the potential VSS and the potential VDD (e.g., the potential (VDD+VSS)/2), which is a base potential, is applied again to the wiring RW[i] and the wiring RW[i+1].

With the above configuration, the product-sum operation can be performed with a small circuit scale. With the above configuration, the product-sum operation can be performed at high speed. With the above configuration, the product-sum operation can be performed with low power.

Note that a transistor with an extremely low off-state current is desirably used as the transistor Tr2, Tr5, Tr6, Tr8, or Tr9. When a transistor with an extremely low off-state current is used as the transistor Tr2, the potential of the node N can be held for a long time. When a transistor with an extremely low off-state current is used as the transistors Tr5 and Tr6, the potential of the gate of the transistor Tr4 can be held for a long time. When a transistor with an extremely low off-state current is used as the transistors Tr8 and Tr9, the potential of the gate of the transistor Tr7 can be held for a long time.

To reduce the off-state current of a transistor, a channel formation region contains a semiconductor with a wide energy gap, for example. The energy gap of the semiconductor is preferably greater than or equal to 2.5 eV, greater than or equal to 2.7 eV, or greater than or equal to 3 eV. An oxide semiconductor can be given as an example of such a semiconductor material. A transistor containing an oxide semiconductor in a channel formation region (hereinafter, such a transistor is referred to as an OS transistor) may be used as the transistor Tr2, Tr5, Tr6, Tr8, or Tr9. The leakage current of an OS transistor normalized by channel width can be lower than or equal to $10 \times 10^{-21}$ A/µm (10 zA/µm) with a source-drain voltage of 10 V at room temperature (approximately 25° C.). The leakage current of the OS transistor used the transistor Tr2, Tr5, Tr6, Tr8, or Tr9 is preferably lower than or equal to $1 \times 10^{-18}$ A, lower than or equal to $1 \times 10^{-21}$ A, or lower than or equal to $1 \times 10^{-24}$ A at room temperature (approximately 25° C.). Alternatively, the leakage current is preferably lower than or equal to $1 \times 10^{-15}$ A, lower than or equal to $1 \times 10^{-18}$ A, or lower than or equal to $1 \times 10^{-21}$ A at 85° C.

An oxide semiconductor is a semiconductor which has a large energy gap and in which electrons are unlikely to be excited and the effective mass of a hole is large. Accordingly, an avalanche breakdown and the like are less likely to occur in the OS transistor than in a generally-used transistor using silicon or the like. Since hot-carrier degradation or the like due to the avalanche breakdown is inhibited, the OS transistor has high drain breakdown voltage and can be driven at high drain voltage.

A channel formation region of the transistor is preferably formed using an oxide semiconductor containing at least one of indium (In) and zinc (Zn). Typical examples of such an oxide semiconductor include an In oxide, a Zn oxide, an In-Zn oxide, and an In-M-Zn oxide (element M is Al, Ti, Ga, Y, Zr, La, Ce, Nd, or Hf). A reduction in impurities serving as electron donors, such as hydrogen, and a reduction in oxygen vacancies can make an oxide semiconductor i-type (intrinsic) or substantially i-type. Such an oxide semiconductor can be referred to as a highly purified oxide semiconductor.

The channel formation region is preferably formed with an oxide semiconductor with a low carrier density. The carrier density of an oxide semiconductor is, for example, preferably less than $8 \times 10^{11}/cm^3$ and more than or equal to $1 \times 10^{-9}/cm^3$. The carrier density is preferably less than $1 \times 10^{11}/cm^3$, and further preferably less than $1 \times 10^{10}/cm^3$.

A highly purified intrinsic or substantially highly purified intrinsic oxide semiconductor has few carrier generation sources, and thus can have a low carrier density. The highly purified intrinsic or substantially highly purified intrinsic oxide has a low density of defect states and accordingly has a low density of trap states in some cases. A charge trapped by a trap state in the oxide semiconductor takes a long time to be released and may behave like a fixed charge. Thus, a transistor whose channel formation region is formed using an oxide semiconductor with a high density of trap states has unstable electrical characteristics in some cases.

Thus, in order to obtain stable electrical characteristics of the OS transistor, it is effective to reduce the concentration of impurities in the channel formation region. In addition, in order to reduce the concentration of impurities in the channel formation region, the concentration of impurities in a region in that is adjacent to the channel formation region is preferably low. Examples of impurities in an oxide semiconductor include hydrogen, nitrogen, carbon, silicon, alkali metal, and alkaline earth metal.

This embodiment can be combined with any of the other embodiments as appropriate.

Embodiment 3

Next, the configuration of a current-voltage converter circuit 18 that has a function of converting analog current flowing through the wiring BL into analog voltage will be described.

Figure 7:
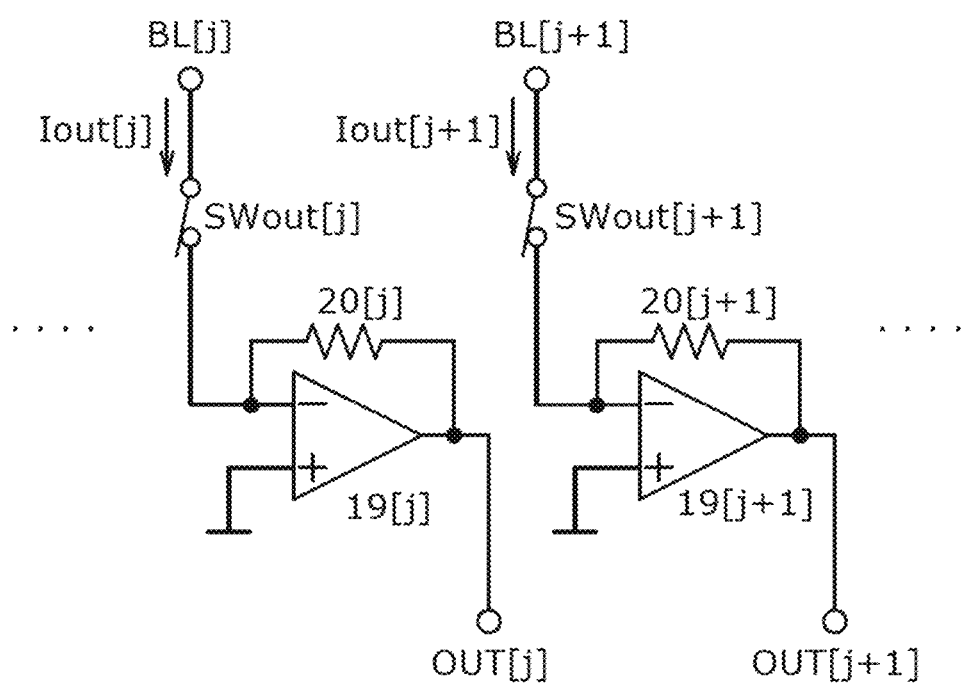
FIG. 7 illustrates a configuration of a current-voltage converter circuit.

FIG. 7 illustrates a configuration example of the current-voltage converter circuit 18. The current-voltage converter circuit 18 includes a switch SWout, an amplifier 19, and a resistor 20, for the wiring BL.

Specifically, in FIG. 7, the wiring BL[j] is electrically connected to an inverting input terminal (−) of an amplifier 19[j] through a switch SWout[j]. A non-inverting input terminal (+) of the amplifier 19[j] is electrically connected to a wiring supplied with a predetermined potential. One terminal of a resistor 20[j] is electrically connected to the inverting input terminal (−) of the amplifier 19[j], and the other terminal of the resistor 20[j] is electrically connected to an output terminal OUT[j] of the amplifier 19[j]. Analog voltage corresponding to the analog current Iout[j] is output from the output terminal OUT[j] of the amplifier 19[j].

A connection relationship between the wiring BL[j+1], a switch SWout[j+1], an amplifier 19[j+1], and a resistor 20[j+1] is similar to that between the wiring BL[j], the switch SWout[j], the amplifier 19[j], and the resistor 20[j].

Embodiment 4

Next, a configuration example of a driver circuit having a function of supplying the first analog potential to the wiring WD or supplying the second analog potential to the wiring RW will be described.

Figure 8:
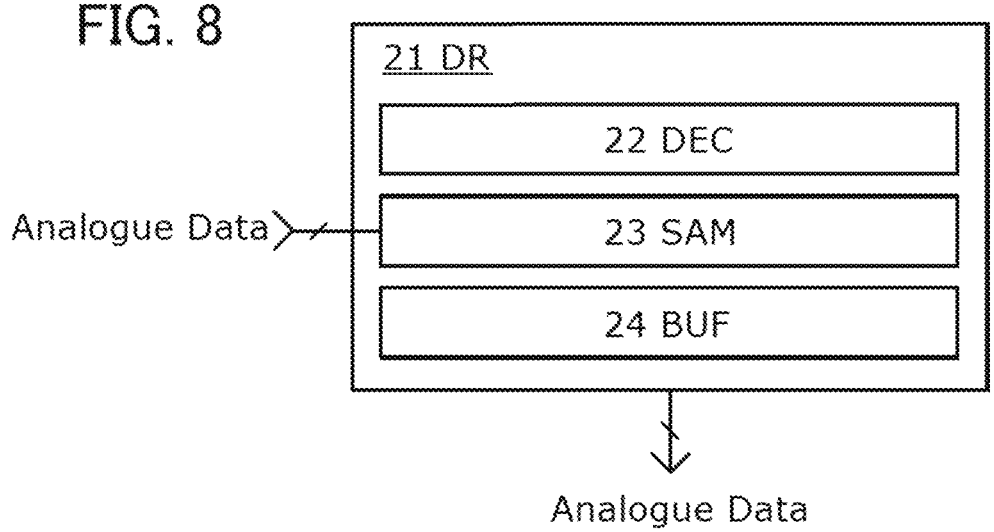
FIG. 8 illustrates a configuration of a driver circuit.

A driver circuit 21 (DR) illustrated in FIG. 8 includes a decoder 22 (DEC), a sampling circuit 23 (SAM), and an analog buffer 24 (BUF).

The decoder 22 has a function of selecting the wiring WD or the wiring RW in accordance with address data of the memory cell MC.

The sampling circuit 23 has a function of sampling analog data of the selected memory cell MC. Specifically, in the case where the driver circuit 21 (DR) has a function of supplying the first analog potential to the wiring WD, the sampling circuit 23 has a function of obtaining and holding the first analog potential for the selected memory cell MC. In the case where the driver circuit 21 (DR) has a function of supplying the second analog potential to the wiring RW, the sampling circuit 23 has a function of obtaining and holding the second analog potential for the selected memory cell MC. The sampled analog data is input to the corresponding wiring WD or wiring RW through the analog buffer.

Figure 9:
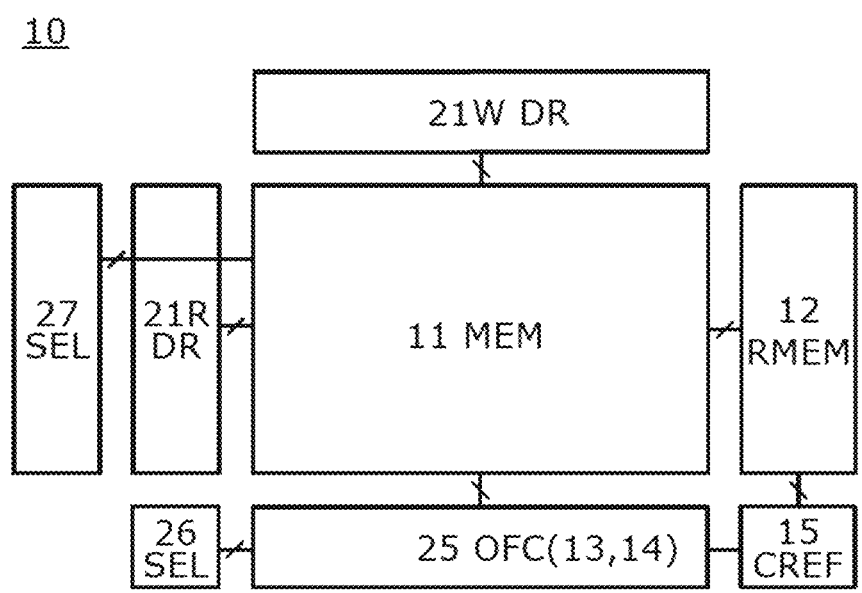
FIG. 9 illustrates a configuration of a semiconductor device.

FIG. 9 illustrates a configuration example of the semiconductor device 10 of one embodiment of the present invention. In FIG. 9, a driver circuit having a function of supplying the first analog potential to the wiring WD is illustrated as a driver circuit 21W (DR), and a driver circuit having a function of supplying the second analog potential to the wiring RW is illustrated as a driver circuit 21R (DR).

The semiconductor device 10 illustrated in FIG. 9 further includes the memory circuit 11 (MEM), the reference memory circuit 12 (RMEM), the current supply circuit 15 (CREF), an offset circuit 25 (OFC), a selection circuit 26 (SEL), and a selection circuit 27 (SEL). The offset circuit 25 includes the circuit 13 and the circuit 14.

The selection circuit 26 (SEL) has a function of controlling potentials supplied to the wiring OSM, the wiring ORM, the wiring ORP, and the wiring OSP (see FIG. 4 or FIG. 6) which are electrically connected to the offset circuit 25. The selection circuit 27 (SEL) has a function of controlling potentials supplied to the wirings WW electrically connected to the memory circuit 11 (MEM) and the reference memory circuit 12 (RMEM).

This embodiment can be combined with any of the other embodiments as appropriate.

Embodiment 5

Next, a structure example of a transistor with an oxide semiconductor will be described.

Figure 10A:
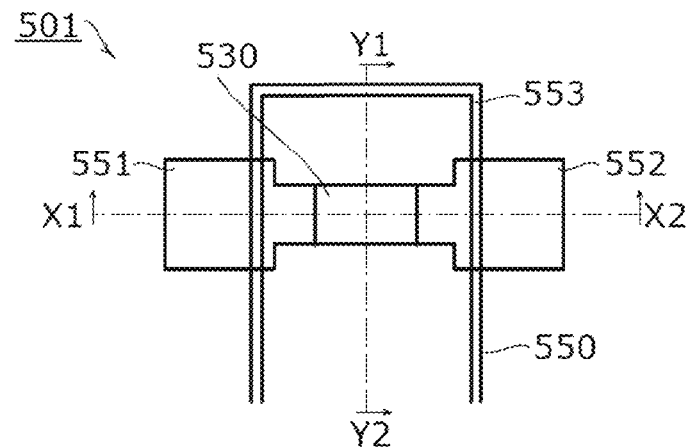
FIGS. 10A to 10C illustrate a structure of a transistor.
Figures 10B, 10C:
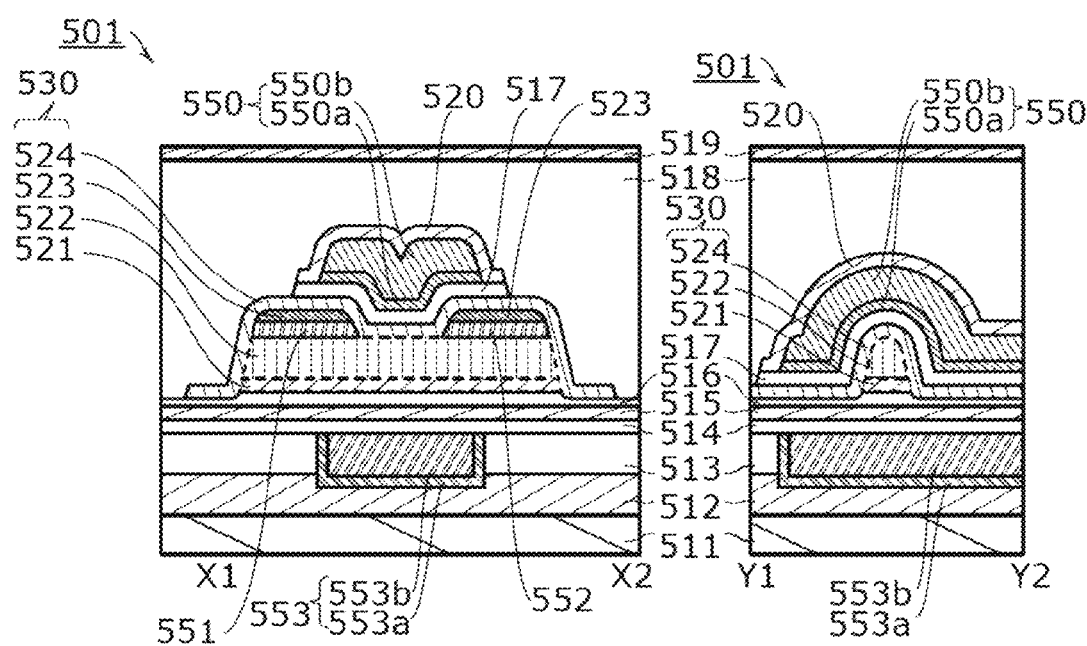

FIG. 10A is a top view illustrating a structure example of a transistor. FIG. 10B is a cross-sectional view taken along a line X1-X2 in FIG. 10A, and FIG. 10C is a cross-sectional view taken along a line Y1-Y2 in FIG. 10A. Here, the direction of the line X1-X2 may be referred to as a channel length direction, and the direction of the line Y1-Y2 may be referred to as a channel width direction. FIG. 10B illustrates a cross-sectional structure of the transistor in the channel length direction, and FIG. 10C illustrates a cross-sectional structure of the transistor in the channel width direction. Note that to clarify the device structure, FIG. 10A does not illustrate some components.

The semiconductor device of one embodiment of the present invention includes insulating layers 512 to 520, metal oxide films 521 to 524, and conductive layers 550 to 553. A transistor 501 is formed over an insulating surface. FIGS. 10A to 10C illustrates a case where the transistor 501 is formed over the insulating layer 511. The transistor 501 is covered by the insulating layers 518 and 519.

Note that the insulating layers, the metal oxide films, the conductive layers or the like that constitute the transistor 501 may each be a single film, or a stack including a plurality of films. These films and layers can be formed by any of a variety of deposition methods such as sputtering, molecular beam epitaxy (MBE), pulsed laser ablation (PLA), chemical vapor deposition (CVD), and atomic layer deposition (ALD). Examples of CVD include plasma CVD, thermal CVD, and metal organic CVD.

The conductive layer 550 includes a region that functions as a gate electrode of the transistor 501. The conductive layers 551 and 552 include regions that function as a source electrode and a drain electrode. The conductive layer 553 includes a region that functions as a back gate electrode. The insulating layer 517 includes a region that functions as a gate insulating layer on the gate electrode (front gate electrode) side, and an insulating layer that is composed of the insulating layers 514 to 516 includes a region that functions as a gate insulating layer on the back gate electrode side. The insulating layer 518 can serve as an interlayer insulating layer. The insulating layer 519 can serve as a barrier layer.

The metal oxide films 521 to 524 will be collectively designated as an oxide layer 530. As illustrated in FIGS. 10B and 10C, the oxide layer 530 includes a region where the metal oxide film 521, the metal oxide film 522, and the metal oxide film 524 are stacked in that order. In addition, a pair of the metal oxide films 523 is positioned over the conductive layer 551 and the conductive layer 552. When the transistor 501 is on, a channel formation region is mainly formed in the metal oxide film 522 of the oxide layer 530.

The metal oxide film 524 covers the metal oxide films 521 to 523, the conductive layer 551, and the conductive layer 552. The insulating layer 517 is positioned between the metal oxide film 523 and the conductive layer 550. The conductive layers 551 and 552 each include a region that overlaps with the conductive layer 550 with the metal oxide film 523, the metal oxide film 524, and the insulating layer 517 positioned therebetween.

The conductive layers 551 and 552 are fabricated from a hard mask that is used in the formation of the metal oxide films 521 and 522. Thus, the conductive layers 551 and 552 do not include a region that is in contact with the side surfaces of the metal oxide films 521 and 522. For example, the metal oxide films 521 and 522 and the conductive layers 551 and 552 can be formed through the following steps. First, a conductive film is formed over a two-layered metal oxide films. The conductive film is processed (etched) into a desired shape, forming a hard mask. The hard mask is used to process the shape of the two-layered metal oxide film, forming the metal oxide films 521 and 522 that are stacked. Next, the hard mask is processed into a desired shape, forming the conductive layers 551 and 552.

Examples of insulating materials used for the insulating layers 511 to 518 include aluminum nitride, aluminum oxide, aluminum nitride oxide, aluminum oxynitride, magnesium oxide, silicon nitride, silicon oxide, silicon nitride oxide, silicon oxynitride, gallium oxide, germanium oxide, yttrium oxide, zirconium oxide, lanthanum oxide, neodymium oxide, hafnium oxide, tantalum oxide, and aluminum silicate. The insulating layers 511 to 518 are formed using a single-layer structure or a stacked-layer structure containing any of these insulating materials. The layers used for the insulating layers 511 to 518 may include a plurality of insulating materials.

Note that in this specification and the like, an oxynitride refers to a substance that contains more oxygen than nitrogen, and a nitride oxide refers to a substance that contains more nitrogen than oxygen.

In order to inhibit the increase in oxygen vacancies in the oxide layer 530, the insulating layers 516 to 518 preferably include oxygen. Further preferably, at least one of the insulating layers 516 to 518 is formed using an insulating film from which oxygen is released by heating (hereinafter such an insulating film is referred to as an insulating film containing excess oxygen). When oxygen is supplied from the insulating film containing excess oxygen to the oxide layer 530, the oxygen vacancies in the oxide layer 530 can be compensated. Thus, reliability and electrical characteristics of the transistor 501 can be improved.

The insulating film containing excess oxygen is a film from which oxygen molecules at more than or equal to $1.0 \times 10^{18}$ molecules/cm$^3$ are released in thermal desorption spectroscopy (TDS) at a surface temperature of the film of higher than or equal to 100° C. and lower than or equal to 700° C., or higher than or equal to 100° C. and lower than or equal to 500° C. The amount of released oxygen molecules is preferably more than or equal to $3.0 \times 10^{20}$ atoms/cm$^3$.

The insulating film containing excess oxygen can be formed by performing treatment for adding oxygen to an insulating film. The treatment for adding oxygen can be performed by heat treatment under an oxygen atmosphere, an ion implantation method, an ion doping method, a plasma immersion ion implantation method, plasma treatment, or the like. As a gas for adding oxygen, an oxygen gas of $^{16}O_2$, $^{18}O_2$, or the like, a nitrous oxide gas, an ozone gas, or the like can be used.

The hydrogen concentration in the insulating layers 512 to 519 is preferably low in order to prevent an increase in the hydrogen concentration in the oxide layer 530. In particular, the concentration of hydrogen in the insulating layers 513 to 518 is preferably low. Specifically, the concentration of hydrogen is lower than or equal to $2 \times 10^{20}$ atoms/cm$^3$, preferably lower than or equal to $5 \times 10^{19}$ atoms/cm$^3$, further preferably lower than or equal to $1 \times 10^{19}$ atoms/cm$^3$, and still further preferably lower than or equal to $5 \times 10^{18}$ atoms/cm$^3$.

The nitrogen concentration in the insulating layers 513 to 518 is preferably low in order to prevent an increase in the nitrogen concentration in the oxide layer 530. Specifically, the concentration of nitrogen is lower than $5 \times 10^{19}$ atoms/cm$^3$, preferably lower than or equal to $5 \times 10^{18}$ atoms/cm$^3$, further preferably lower than or equal to $1 \times 10^{18}$ atoms/cm$^3$, and still further preferably lower than or equal to $5 \times 10^{17}$ atoms/cm$^3$.

The hydrogen concentration and the nitrogen concentration described above are measured by secondary ion mass spectrometry (SIMS).

In the transistor 501, the oxide layer 530 is preferably surrounded by an insulating layer with oxygen and hydrogen barrier properties (hereinafter such an insulating layer is referred to as a barrier layer). A use of such a structure prevents release of oxygen from the oxide layer 530, and intrusion of hydrogen into the oxide layer 530. Thus, reliability and electrical characteristics of the transistor 501 can be improved.

For example, the insulating layer 519 functions as a barrier layer and at least one of the insulating layers 511, 512, and 514 functions as a barrier layer. The barrier layer can be formed using a material such as aluminum oxide, aluminum oxynitride, gallium oxide, gallium oxynitride, yttrium oxide, yttrium oxynitride, hafnium oxide, hafnium oxynitride, or silicon nitride.

Structure example of the insulating layers 511 to 518 is described. In this example, each of the insulating layers 511, 512, 515, and 519 function as a barrier layer. The insulating layers 516 to 518 are oxide layers containing excess oxygen. The insulating layer 511 is formed using silicon nitride. The insulating layer 512 is formed using aluminum oxide. The insulating layer 513 is formed using silicon oxynitride. The insulating layers 514 to 516 that serve as the gate insulating layers in the back gate side are formed using a stack including silicon oxide, aluminum oxide, and silicon oxide. The insulating layer 517 that serves as the gate insulating layer in the front gate side is formed using silicon oxynitride. The insulating layer 518 that serves as the interlayer insulating layer is formed using silicon oxide. The insulating layer 519 is formed using aluminum oxide.

Examples of a conductive material used for the conductive layers 550 to 553 include a metal such as molybdenum, titanium, tantalum, tungsten, aluminum, copper, chromium, neodymium, or scandium; and a metal nitride containing any of the above metals as its component (tantalum nitride, titanium nitride, molybdenum nitride, or tungsten nitride). Alternatively, materials such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide containing silicon oxide can be used for the conductive layers 550 to 553.

Structure example of the conductive layers 550 to 553 is described. The conductive layer 550 is a single layer of tantalum nitride or tungsten. Alternatively, the conductive layer 550 is a stack including tantalum nitride and tantalum or tantalum nitride. The conductive layer 551 is formed with a single layer of tantalum nitride, or a stack including tantalum nitride and tungsten. The structure of the conductive layer 552 is the same as that of the conductive layer 551.

The conductive layer 553 is formed with a single layer of tantalum nitride, or a stack including tantalum nitride and tungsten.

In order to reduce the off-state current of the transistor 501, for example, the energy gap of the metal oxide film 522 is preferably large. The energy gap of the metal oxide film 522 is greater than or equal to 2.5 eV and less than or equal to 4.2 eV, preferably greater than or equal to 2.8 eV and less than or equal to 3.8 eV, and further preferably greater than or equal to 3 eV and less than or equal to 3.5 eV.

The oxide layer 530 preferably exhibits crystallinity. At least the metal oxide film 522 preferably exhibits crystallinity. With the structure described above, the transistor 501 can have high reliability and favorable electrical characteristics.

As the oxide of the metal oxide film 522, typically, an In—Ga oxide, an In—Zn oxide, or an In-M-Zn oxide (M is Al, Ga, Y, or Sn) can be used. The metal oxide film 522 is not limited to the oxide layer containing indium. The metal oxide film 522 can be formed using a Zn-Sn oxide, a Ga—Sn oxide, or a Zn—Mg oxide, for example. The metal oxide films 521, 523 and 524 can be formed using an oxide that is similar to the oxide of the metal oxide film 522. In particular, each of the metal oxide films 521, 523 and 524 can be formed with Ga oxide.

When an interface level is formed at the interface between the metal oxide film 522 and the metal oxide film 521, a channel region is formed also in the vicinity of the interface, which causes a change in the threshold voltage of the transistor 501. It is preferable that the metal oxide film 521 contains at least one of the metal elements contained in the metal oxide film 522. Accordingly, an interface level is unlikely to be formed at the interface between the metal oxide film 522 and the metal oxide film 521, and variations in the electrical characteristics of the transistor 501, such as the threshold voltage can be reduced.

It is preferable that the metal oxide film 524 contains at least one of the metal elements contained in the metal oxide film 522 as its component because interface scattering is unlikely to occur at the interface between the metal oxide film 522 and the metal oxide film 524, and carrier transfer is not inhibited. Thus, the field-effect mobility of the transistor 501 can be increased.

It is preferable that the metal oxide film 522 have the highest carrier mobility among the metal oxide films 521 to 524. Accordingly, a channel can be formed in the metal oxide film 522 that is apart from the insulating layers 516 and 517.

For example, in a metal oxide containing indium such as an In-M-Zn oxide, carrier mobility can be increased by an increase in the indium content. In the In-M-Zn oxide, the s orbital of heavy metal mainly contributes to carrier transfer, and when the indium content in the oxide semiconductor is increased, overlaps of the s orbitals of indium atoms are increased; therefore, an oxide having a high content of indium has higher mobility than an oxide having a low content of indium. Therefore, an oxide having a high content of indium is used as the metal oxide film, so that carrier mobility can be increased.

Thus, for example, the metal oxide film 522 is formed using an In—Ga—Zn oxide, and the metal oxide films 521 and 523 are formed using a Ga oxide. For example, when the metal oxide films 521 to 523 are formed using an In-M-Zn oxide, the indium content of the metal oxide film 522 is made higher than the indium content of the metal oxide films 521 and 523. When the In-M-Zn oxide is formed by sputtering, the indium content can be changed by a change in the atomic ratio of metal elements of a target.

For example, it is preferable that the atomic ratio of metal elements of a target used for depositing the metal oxide film 522 be In:M:Zn=1:1:1, 3:1:2, or 4:2:4.1. For example, it is preferable that the atomic ratio of metal elements of a target used for depositing the metal oxide films 521 and 523 be In:M:Zn=1:3:2, or 1:3:4. The atomic ratio of an In-M-Zn oxide deposited using a target of InM:Zn=4:2:4.1 is approximately In:M:Zn=4:2:3.

For the transistor 501 to have stable electrical characteristics, it is preferable to reduce the concentration of impurities in the oxide layer 530. In the metal oxide, hydrogen, nitrogen, carbon, silicon, and a metal element other than a main component are impurities. For example, hydrogen and nitrogen form donor levels to increase the carrier density, and silicon and carbon form impurity levels in the metal oxide. The impurity levels serve as traps and might cause deterioration of electrical characteristics of the transistor.

For example, the oxide layer 530 includes a region where the concentration of silicon is lower than or equal to $2\times10^{18}$ atoms/cm$^3$, or preferably lower than or equal to $2\times10^{17}$ atoms/cm$^3$. The same applies to the concentration of carbon in the oxide layer 530.

The oxide layer 530 includes a region where the concentration of alkali metal is lower than or equal to $1\times10^{18}$ atoms/cm$^3$, or preferably lower than or equal to $2\times10^{16}$ atoms/cm$^3$. The same applies to the concentration of alkaline earth metal in the oxide layer 530.

The oxide layer 530 includes a region where the concentration of nitrogen is lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

The oxide layer 530 includes a region where the concentration of hydrogen is lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$.

The above concentrations of the impurities in the oxide layer 530 are measured by SIMS.

In the case where the metal oxide film 522 contains oxygen vacancies, donor levels are formed by entry of hydrogen into sites of oxygen vacancies in some cases, to cause reduction in the on-state current of the transistor 501. Note that sites of oxygen vacancies become more stable by entry of oxygen than by entry of hydrogen. Thus, by reducing oxygen vacancies in the metal oxide film 522, the on-state current of the transistor 501 can be increased in some cases. Consequently, preventing entry of hydrogen into sites of oxygen vacancies by a reduction in hydrogen in the metal oxide film 522 is effective in improving on-state current characteristics.

Hydrogen contained in a metal oxide reacts with oxygen bonded to a metal atom to be water, and thus causes an oxygen vacancy, in some cases. An electron serving as a carrier is generated due to entry of hydrogen into the oxygen vacancy, in some cases. Furthermore, in some cases, bonding of part of hydrogen to oxygen bonded to a metal atom causes generation of an electron serving as a carrier. Thus, the transistor 501 is likely to be normally-on when the metal oxide film 522 contains hydrogen because the metal oxide film 522 includes a channel formation region. Accordingly, it is preferable that hydrogen in the metal oxide film 522 be reduced as much as possible.

FIGS. 10A to 10C illustrate an example in which the oxide layer 530 has a four-layer structure; however, one embodiment of the present invention is not limited thereto. For example, the oxide layer 530 can have a three-layer structure without the metal oxide film 521 or without the metal oxide film 523. Alternatively, the oxide layer 530 may include one or more metal oxide layers that are similar to the metal oxide films 521 to 524 at two or more of the following positions: between given layers in the oxide layer 530, over the oxide layer 530, and below the oxide layer 530.

Figure 11:
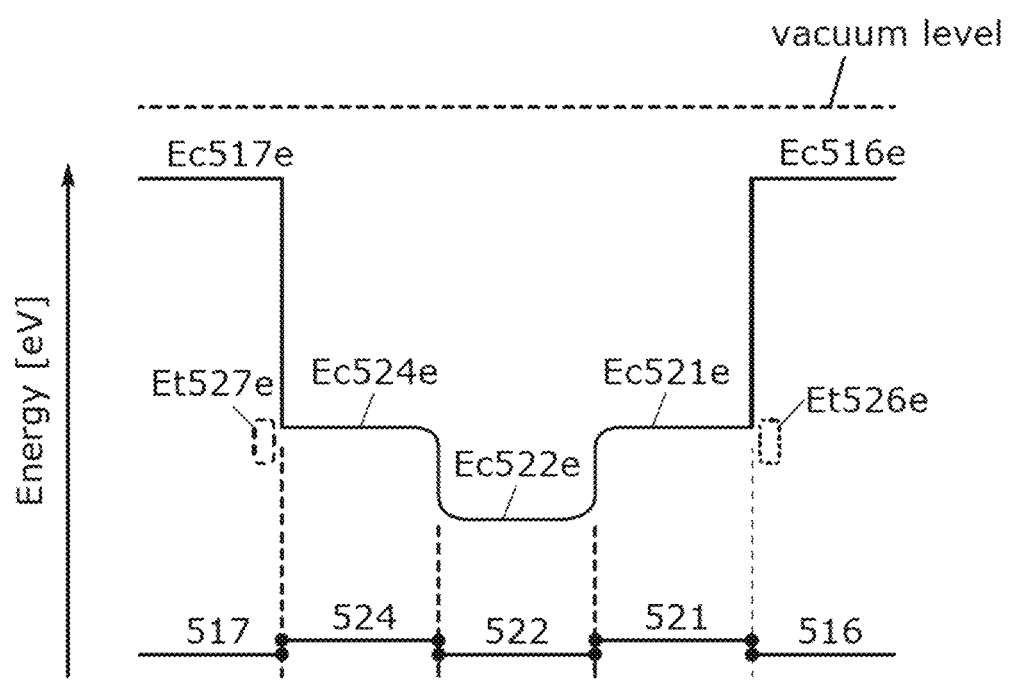
FIG. 11 is a schematic diagram of an energy band structure.

Effects of the stack including the metal oxide films 521, 522, and 524 are described with reference to FIG. 11. FIG. 11 is a schematic diagram showing the energy band structure of a channel formation region of the transistor 501.

In FIG. 11, Ec516e, Ec521e, Ec522e, Ec524e, and Ec517e indicate the energy of the bottom of the conduction band of the insulating layer 516, the metal oxide film 521, the metal oxide film 522, the metal oxide film 524, and the insulating layer 517, respectively.

Here, a difference in energy between the vacuum level and the bottom of the conduction band (the difference is also referred to as electron affinity) corresponds to a value obtained by subtracting an energy gap from a difference in energy between the vacuum level and the top of the valence band (the difference is also referred to as an ionization potential). The energy gap can be measured using a spectroscopic ellipsometer (UT-300 manufactured by HORIBA JOBIN YVON S.A.S.). The energy difference between the vacuum level and the top of the valence band can be measured using an ultraviolet photoelectron spectroscopy (UPS) device (VersaProbe manufactured by ULVAC-PHI, Inc.).

Since the insulating layers 516 and 517 are insulators, Ec516e and Ec517e are closer to the vacuum level than Ec521e, Ec522e, and Ec524e (i.e., the insulating layers 516 and 517 have a lower electron affinity than the metal oxide films 521, 522, and 524).

The metal oxide film 522 has a higher electron affinity than the metal oxide films 521 and 524. For example, the difference in electron affinity between the metal oxide films 521 and 522 and the difference in electron affinity between the metal oxide films 522 and 524 are each greater than or equal to 0.07 eV and less than or equal to 1.3 eV, preferably greater than or equal to 0.1 eV and less than or equal to 0.7 eV, further preferably greater than or equal to 0.15 eV and less than or equal to 0.4 eV. Note that the electron affinity is a difference in energy between the vacuum level and the bottom of the conduction band.

When voltage is applied to the gate electrode (the conductive layer 550) of the transistor 501, a channel is mainly formed in the metal oxide film 522 having the highest electron affinity among the metal oxide films 521, 522, and 524.

An indium gallium oxide has low electron affinity and a high oxygen-blocking property. Therefore, the metal oxide film 524 preferably includes an indium gallium oxide. The gallium atomic ratio [Ga/(In+Ga)] is, for example, higher than or equal to 70%, preferably higher than or equal to 80%, further preferably higher than or equal to 90%.

In some cases, there is a mixed region of the metal oxide films 521 and 522 between the metal oxide films 521 and 522. Furthermore, in some cases, there is a mixed region of the metal oxide films 522 and 524 between the metal oxide films 522 and 524. Because the mixed region has low interface state density, a region with a stack formed with the metal oxide films 521, 522, and 524 has a band structure where energy at each interface and in the vicinity of the interface is changed continuously (continuous junction).

Electrons transfer mainly through the metal oxide film 522 in the oxide layer 530 having such an energy band structure. Therefore, even when an interface state exists at an interface between the metal oxide film 521 and the insulating layer 516 or an interface between the metal oxide film 524 and the insulating layer 517, electron movement in the oxide layer 530 is less likely to be inhibited and the on-state current of the transistor 501 can be increased.

Although trap states Et526e and Et527e due to impurities or defects might be formed in the vicinity of the interface between the metal oxide film 521 and the insulating layer 516 and the vicinity of the interface between the metal oxide film 524 and the insulating layer 517 as illustrated in FIG. 11, the metal oxide film 522 can be separated from the trap states Et526e and Et527e owing to the existence of the metal oxide films 521 and 524.

Note that when the difference between Ec521e and Ec522e is small, an electron in the metal oxide film 522 might reach the trap state Et526e by passing over the difference in energy. Since the electron is trapped at the trap state Et526e, negative fixed charge is generated at the interface with the insulating film, causing the threshold voltage of the transistor to be shifted in a positive direction. The same applies to the case where a difference in energy between Ec522e and Ec524e is small.

Each of the difference in energy between Ec521e and Ec522e and the difference in energy between Ec522e and Ec524e is preferably greater than or equal to 0.1 eV, further preferably greater than or equal to 0.15 eV so that a change in the threshold voltage of the transistor 501 can be reduced and the transistor 501 can have favorable electrical characteristics.

The transistor 501 does not necessarily include a back gate electrode.

FIG. 12 illustrates an example of a stacked-layer structure of the transistor Tr1, the transistor Tr2, and the capacitor C1 included in the memory cell MC illustrated in FIG. 3.

The semiconductor device 10 includes a stack including a CMOS tier 561, wiring tiers $W_1$ to $W_5$, a transistor tier 562, and wiring tiers $W_6$ and $W_7$.

A transistor including silicon in a channel formation region is provided in the CMOS tier 561. An active layer of the transistor Tr1 is formed in a single crystalline silicon wafer 560. A gate of the transistor Tr1 is electrically connected to the other of a source and a drain of the transistor Tr2 and a second electrode 565 of the capacitor C1 through the wiring tiers $W_1$ to $W_5$.

The transistor Tr2 is provided in the transistor tier 562. The transistor Tr2 in FIG. 12 has a structure similar to that of the transistor 501 (FIGS. 10A to 10C). Note that in this embodiment, the transistor Tr2 includes its back gate electrode in the wiring tier $W_5$. The capacitor C1 is provided in the wiring tier $W_6$.

This embodiment can be combined with any of the other embodiments as appropriate.

Embodiment 6

In this embodiment, an oxide semiconductor is described. An oxide semiconductor is classified into a single crystal oxide semiconductor and a non-single-crystal oxide semiconductor. Examples of a non-single-crystal oxide semiconductor include a c-axis-aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and an nc-OS.

An amorphous structure is generally thought to be isotropic and have no non-uniform structure, to be metastable and not to have fixed positions of atoms, to have a flexible bond angle, and to have a short-range order but have no long-range order, for example.

This means that a stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. In contrast, an a-like OS, which is not isotropic, has an unstable structure that contains a void. Because of its instability, an a-like OS is close to an amorphous oxide semiconductor in terms of physical properties.

A CAAC-OS is one of oxide semiconductors having a plurality of c-axis aligned crystal parts (also referred to as pellets).

As described above, the CAAC-OS has c-axis alignment, includes crystal parts (nanocrystals) connected in the a-b plane direction, and has a crystal structure with distortion. The size of the crystal part is greater than or equal to 1 nm, or greater than or equal to 3 nm. For this reason, the crystal part of the CAAC-OS can be referred to as a nanocrystal, and the CAAC-OS can also be referred to as an oxide semiconductor including a c-axis-aligned a-b-plane-anchored (CAA) crystal.

The CAAC-OS is an oxide semiconductor with high crystallinity. Entry of impurities, formation of defects, or the like might decrease the crystallinity of an oxide semiconductor. This means that the CAAC-OS has reduced impurities and defects (e.g., oxygen vacancy).

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

The characteristics of an oxide semiconductor having impurities or defects might be changed by light, heat, or the like. Impurities contained in the oxide semiconductor might serve as carrier traps or carrier generation sources. For example, oxygen vacancy in the oxide semiconductor might serve as a carrier trap or serve as a carrier generation source when hydrogen is captured therein.

The CAAC-OS having small amounts of impurities and oxygen vacancy is an oxide semiconductor with a low carrier density. Specifically, an oxide semiconductor with a carrier density of lower than $8 \times 10^{11}$ cm$^{-1}$, preferably lower than $1 \times 10^{11}$ cm$^{-3}$, further preferably lower than $1 \times 10^{10}$ cm$^{-3}$, and higher than or equal to $1 \times 10^{-9}$ cm$^{-3}$ can be used. Such an oxide semiconductor is referred to as a highly purified intrinsic or substantially highly purified intrinsic oxide semiconductor. A CAAC-OS has a low impurity concentration and a low density of defect states. Thus, the CAAC-OS can be referred to as an oxide semiconductor having stable characteristics.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. Note that there is no regularity of crystal orientation between different crystal parts in the nc-OS. Thus, the orientation of the whole film is not observed. Since there is no regularity of crystal orientation between the crystal parts (nanocrystals), the nc-OS can also be referred to as an oxide semiconductor including randomly aligned nanocrystals (RANC) or an oxide semiconductor including non-aligned nanocrystals (NANC).

Since the crystal of the nc-OS does not have alignment, the nc-OS cannot be distinguished from an a-like OS or an amorphous oxide semiconductor in some cases depending on an analysis method.

The a-like OS has lower density than the nc-OS and the CAAC-OS. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. Note that it is difficult to deposit an oxide semiconductor having a density of lower than 78% of the density of the single crystal oxide semiconductor.

For example, in the case of an oxide semiconductor having an atomic ratio of In:Ga:Zn=1:1:1, the density of single crystal InGaZnO$_4$ with a rhombohedral crystal structure is 6.357 g/cm$^3$. Accordingly, in the case of the oxide semiconductor having an atomic ratio of In:Ga:Zn=1:1:1, the density of the a-like OS is higher than or equal to 5.0 g/cm$^3$ and lower than 5.9 g/cm$^3$. For example, in the case of the oxide semiconductor having an atomic ratio of In:Ga:Zn=1:1:1, the density of each of the nc-OS and the CAAC-OS is higher than or equal to 5.9 g/cm$^3$ and lower than 6.3 g/cm$^3$.

Note that in the case where an oxide semiconductor having a certain composition does not exist in a single crystal structure, single crystal oxide semiconductors with different compositions are combined at an adequate ratio, which makes it possible to estimate density equivalent to that of a single crystal oxide semiconductor with the desired composition. The density of a single crystal oxide semiconductor having the desired composition can be estimated using a weighted average according to the combination ratio of the single crystal oxide semiconductors with different compositions. Note that it is preferable to use as few kinds of single crystal oxide semiconductors as possible to estimate the density.

As described above, oxide semiconductors have various structures and various properties. Note that an oxide semiconductor may be a stacked layer including two or more films of an amorphous oxide semiconductor, an a-like OS, an nc-OS, and a CAAC-OS, for example. The structure of the oxide semiconductor can be identified by X-ray diffraction (XRD), nanobeam electron diffraction, observation with a transmission electron microscope (TEM), or the like.

The carrier density of an oxide semiconductor will be described below.

Examples of a factor affecting the carrier density of an oxide semiconductor include oxygen vacancy ($V_o$) and impurities in the oxide semiconductor.

As the amount of oxygen vacancy in the oxide semiconductor increases, the density of defect states increases when hydrogen is bonded to the oxygen vacancy (this state is also referred to as $V_oH$). The density of defect states also increases with an increase in the amount of impurity in the oxide semiconductor. Hence, the carrier density of an oxide semiconductor can be controlled by controlling the density of defect states in the oxide semiconductor.

A transistor using the oxide semiconductor in a channel region will be described below.

The carrier density of the oxide semiconductor is preferably reduced in order to inhibit the negative shift of the threshold voltage of the transistor or reduce the off-state current of the transistor. In order to reduce the carrier density of the oxide semiconductor, the impurity concentration in the oxide semiconductor is reduced so that the density of defect states can be reduced. In this specification and the like, a state with a low impurity concentration and a low density of defect states is referred to as a highly purified intrinsic or substantially highly purified intrinsic state. The carrier density of a highly purified intrinsic oxide semiconductor is lower than $8\times10^{15}$ cm$^{-3}$, preferably lower than $1\times10^{11}$ cm$^{-3}$, and further preferably lower than $1\times10^{10}$ cm$^{-3}$ and is higher than or equal to $1\times10^{-9}$ cm$^{-3}$.

In contrast, the carrier density of the oxide semiconductor is preferably increased in order to improve the on-state current of the transistor or improve the field-effect mobility of the transistor. In order to increase the carrier density of the oxide semiconductor, the impurity concentration or the density of defect states in the oxide semiconductor is slightly increased. Alternatively, the bandgap of the oxide semiconductor is preferably narrowed. For example, an oxide semiconductor that has a slightly high impurity concentration or a slightly high density of defect states in the range where a favorable on/off ratio is obtained in the $I_d$-$V_g$ characteristics of the transistor can be regarded as substantially intrinsic. Furthermore, an oxide semiconductor that has a high electron affinity and thus has a narrow bandgap so as to increase the density of thermally excited electrons (carriers) can be regarded as substantially intrinsic. Note that a transistor using an oxide semiconductor with higher electron affinity has lower threshold voltage.

The aforementioned oxide semiconductor with an increased carrier density has a slightly n-type conductivity; thus, it can be referred to as a "slightly-n" oxide semiconductor.

The carrier density of a substantially intrinsic oxide semiconductor is preferably higher than or equal to $1\times10^5$ cm$^{-3}$ and lower than $1\times10^{18}$ cm$^{-3}$, further preferably higher than or equal to $1\times10^7$ cm$^{-3}$ and lower than or equal to $1\times10^{17}$ cm$^{-3}$, still further preferably higher than or equal to $1\times10^9$ cm$^{-3}$ and lower than or equal to $5\times10^{16}$ cm$^{-3}$, yet further preferably higher than or equal to $1\times10^{10}$ cm$^{-3}$ and lower than or equal to $1\times10^{16}$ cm$^{-3}$, and yet still preferably higher than or equal to $1\times10^{11}$ cm$^{-3}$ and lower than or equal to $1\times10^{15}$ cm$^{-3}$.

This embodiment can be combined with any of the other embodiments as appropriate.

Embodiment 7

Figure 13A:
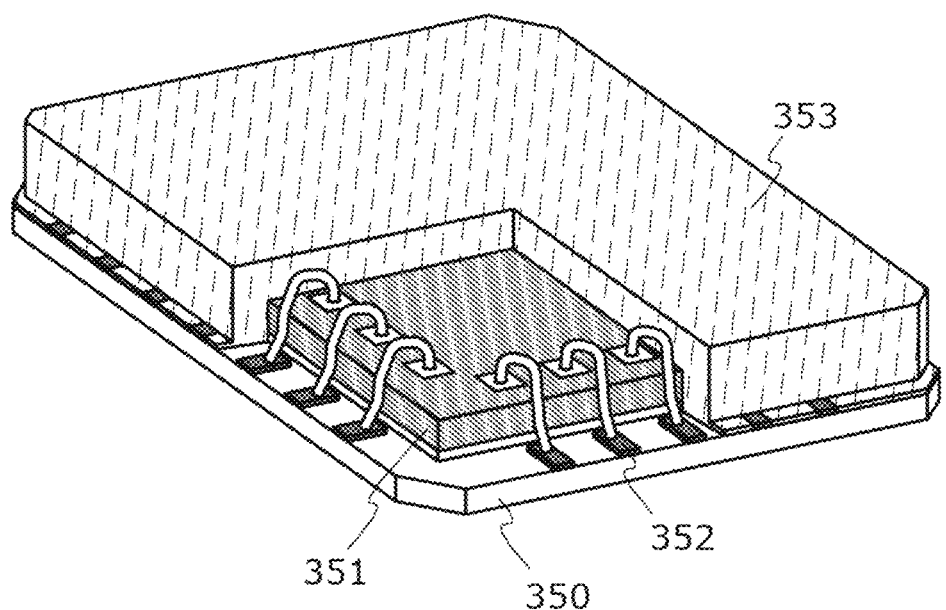
FIGS. 13A and 13B illustrate a chip and a module.

FIG. 13A is a perspective view illustrating a cross-sectional structure of a package using a lead frame interposer.

In the package in FIG. 13A, a chip 351 corresponding to the semiconductor device of one embodiment of the present invention is connected to terminals 352 over an interposer 350 by wire bonding. The terminals 352 are placed on a surface of the interposer 350 on which the chip 351 is mounted. The chip 351 can be sealed by a mold resin 353 in which case the chip 351 is sealed so that part of each of the terminals 352 is exposed.

Figure 13B:
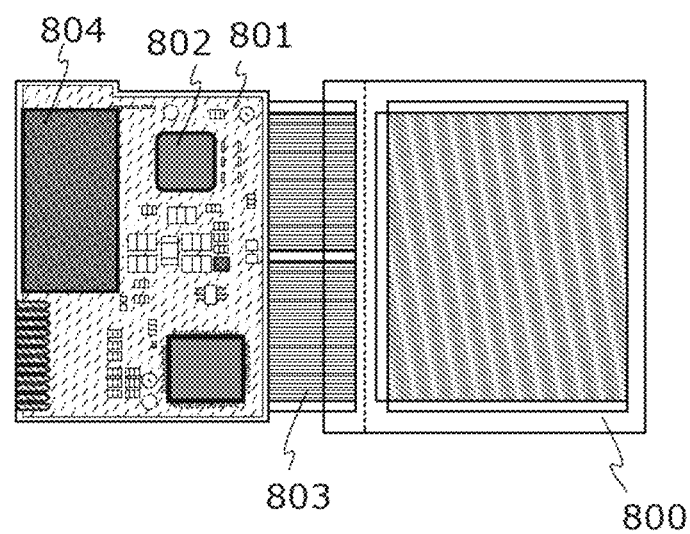

FIG. 13B illustrates the structure of a module of an electronic device in which the package is mounted on a circuit board.

In the module of a cellular phone in FIG. 13B, a package 802 and a battery 804 are mounted on a printed wiring board 801. In addition, the printed wiring board 801 is mounted on a panel 800 including display elements by an FPC 803.

Figure 14:
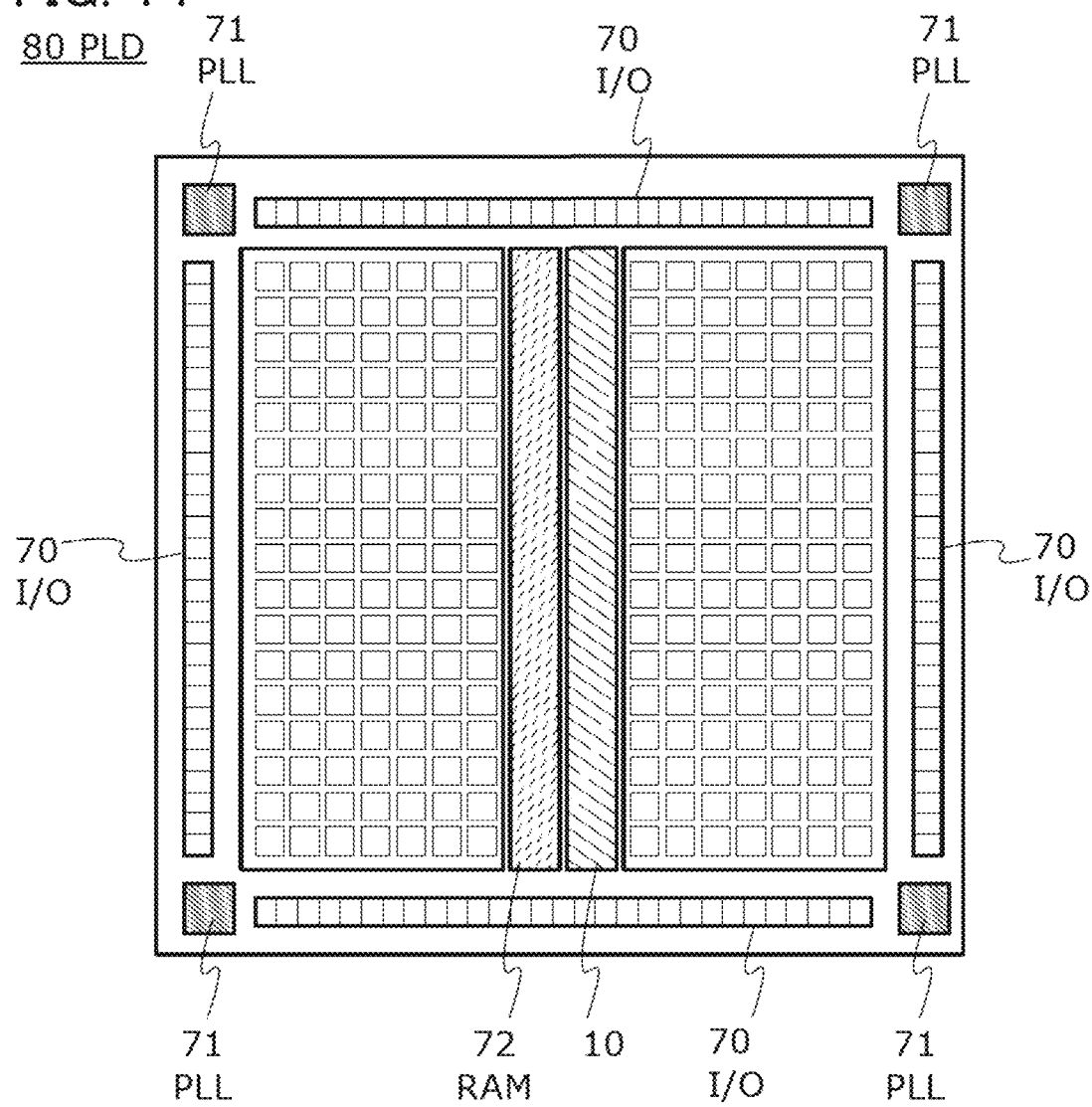
FIG. 14 illustrates a configuration of a PLD.

FIG. 14 illustrates a configuration example of a programmable logic device (PLD) including the semiconductor device 10, which is the semiconductor device of one embodiment of the present invention. A PLD 80 illustrated in FIG. 14 includes an I/O 70, a phase lock loop (PLL) 71, a RAM 72, and the semiconductor device 10. The I/O 70 functions as an interface that controls input and output of signals from and to an external circuit of the PLD 80. The PLL 71 has a function of generating a signal CLK. The RAM 72 has a function of storing data used for logic operation. The semiconductor device 10 functions as a product-sum operation circuit.

This embodiment can be combined with any of the other embodiments as appropriate.

Embodiment 8

A storage device in one embodiment of the present invention can be used for display devices, personal computers, or image reproducing devices provided with recording media (typically, devices that reproduce the content of recording media such as digital versatile discs (DVDs) and have displays for displaying the reproduced images). Other than the above, as an electronic device which can be provided with the memory device according to one embodiment of the present invention, mobile phones, game machines (including portable game machines), portable information terminals, e-book readers, video cameras, cameras (e.g., digital still cameras), goggle-type displays (head mounted displays), navigation systems, audio reproducing devices (e.g., car audio units and digital audio players), copiers, facsimiles, printers, multifunction printers, automated teller machines (ATM), vending machines, medical equipment and the like can be given. FIGS. 15A to 15F illustrate specific examples of these electronic devices.

FIG. 15A illustrates a portable game machine, which includes a housing 5001, a housing 5002, a display portion 5003, a display portion 5004, a microphone 5005, speakers 5006, an operation key 5007, a stylus 5008, and the like. The memory device of one embodiment of the present invention can be used for a variety of integrated circuits included in portable game machines. Note that although the portable game console illustrated in FIG. 15A has the two display portions 5003 and 5004, the number of display portions included in the portable game console is not limited to two.

FIG. 15B illustrates a notebook personal computer, which includes a housing 5401, a display portion 5402, a keyboard 5403, a pointing device 5404, and the like. The semiconductor device of one embodiment of the present invention can be used for a variety of integrated circuits included in notebook personal computers.

FIG. 15C illustrates a display device including a housing 5301, a display portion 5302, a supporting base 5303, and the like. The semiconductor device according to one embodiment of the present invention can be used for the display portion 5302. Note that the display device includes all display devices for displaying information, such as display devices for personal computers, display devices for receiving TV broadcasts, and display devices for displaying advertisements.

FIG. 15D illustrates a video camera including a first housing 5801, a second housing 5802, a display portion 5803, operation keys 5804, a lens 5805, a joint 5806, and the like. The semiconductor device of one embodiment of the present invention can be used for a variety of integrated circuits included in video cameras. The operation keys 5804 and the lens 5805 are provided in the first housing 5801, and the display portion 5803 is provided in the second housing 5802. The first housing 5801 and the second housing 5802 are connected to each other with the joint 5806, and the angle between the first housing 5801 and the second housing 5802 can be changed with the joint 5806. Images displayed on the display portion 5803 may be switched in accordance with the angle at the joint 5806 between the first housing 5801 and the second housing 5802.

FIG. 15E illustrates a display device, which includes a housing 5701 having a curved surface, a display portion 5702, and the like. When a flexible substrate is used for the semiconductor device according to one embodiment of the present invention, it is possible to use the semiconductor device as the display portion 5702 supported by the housing 5701 having a curved surface. It is thus possible to provide a user-friendly display device that is flexible and lightweight.

FIG. 15F illustrates a mobile phone, which includes a display portion 5902, a microphone 5907, a speaker 5904, a camera 5903, an external connection port 5906, and an operation button 5905 in a housing 5901 with a curved surface. The memory device of one embodiment of the present invention can be used for a variety of integrated circuits for controlling operation of the display device used as the display portion 5902.

This embodiment can be combined with any of the other embodiments as appropriate.

EXPLANATION OF REFERENCE

10: semiconductor device, 11: memory circuit, 12: reference memory circuit, 13: circuit, 14: circuit, 15: current supply circuit, 18: current-voltage converter circuit, 19: amplifier, 20: resistor, 21: driver circuit, 21R: driver circuit, 22: decoder, 23: sampling circuit, 24: analog buffer, 25: offset circuit, 26: selection circuit, 27: selection circuit, 71: PLL, 72: RAM, 80: PLD, 350: interposer, 351: chip, 352: terminal, 353: mold resin, 501: transistor, 511: insulating layer, 512: insulating layer, 513: insulating layer, 514: insulating layer, 515: insulating layer, 516e: Ec, 516: insulating layer, 517e: Ec, 517: insulating layer, 518: insulating layer, 519: insulating layer, 520: insulating layer, 521: metal oxide film, 521e: Ec, 522: metal oxide film, 522e: Ec, 523: metal oxide film, 524: metal oxide film, 524e: Ec, 527e: Et, 530: oxide layer, 550: conductive layer, 551: conductive layer, 552: conductive layer, 553: conductive layer, 560: single crystalline silicon wafer, 561: CMOS tier, 562: transistor tier, 565: electrode, 800: panel, 801: printed wiring board, 802: package, 803: FPC, 804: battery, 5001: housing, 5002: housing, 5003: display portion, 5004: display portion, 5005: microphone, 5006: speaker, 5007: operation key, 5008: stylus, 5301: housing, 5302: display portion, 5303: supporting base, 5401: housing, 5402: display portion, 5403: keyboard, 5404: pointing device, 5701: housing, 5702: display portion, 5801: housing, 5802: housing, 5803: display portion, 5804: operation key, 5805: lens, 5806: joint, 5901: housing, 5902: display portion, 5903: camera, 5904: speaker, 5905: button, 5906: external connection port, and 5907: microphone.

This application is based on Japanese Patent Application serial no. 2016-046853 filed with Japan Patent Office on Mar. 10, 2016, the entire contents of which are hereby incorporated by reference.

The invention claimed is:
1. A semiconductor device comprising:
a memory cell, a reference memory cell, a first circuit, and a second circuit,
wherein the memory cell is configured to generate a first current corresponding to first analog data and to generate a second current corresponding to the first analog data and second analog data,
wherein the reference memory cell is configured to generate a reference current corresponding to reference data,
wherein the first circuit is configured to generate and hold a third current corresponding to a difference between the first current and the reference current when the first current is lower than the reference current,
wherein the second circuit is configured to generate and hold a fourth current corresponding to a difference between the first current and the reference current when the first current is higher than the reference current, and
wherein one of the first circuit and the second circuit is configured to generate a fifth current corresponding to third analog data from the second current and one of the third current and the fourth current.

2. The semiconductor device according to claim 1, further comprising:
a first wiring electrically connected to the first circuit, the second circuit, and the memory cell; and
a second wiring electrically connected to the reference memory cell.

3. The semiconductor device according to claim 1, further comprising:
a current source circuit;
a first wiring electrically connected to the current source circuit, the first circuit, the second circuit, and the memory cell; and
a second wiring electrically connected to the current source circuit and the reference memory cell.

4. The semiconductor device according to claim 1,
wherein each of the memory cell and the reference memory cell comprises a transistor, and
wherein the semiconductor device further comprises:
a current source circuit;
a first wiring electrically connected to the current source circuit, the first circuit, the second circuit, and one of a source and a drain of the transistor of the memory cell; and
a second wiring electrically connected to the current source circuit and one of a source and a drain of the transistor of the reference memory cell.

5. The semiconductor device according to claim 1,
wherein each of the memory cell and the reference memory cell comprises a first transistor, a second transistor, and a capacitor,
wherein the semiconductor device further comprises:
a current source circuit;

a first wiring electrically connected to the current source circuit, the first circuit, the second circuit, and one of a source and a drain of the first transistor of the memory cell; and a second wiring electrically connected to the current source circuit and one of a source and a drain of the first transistor of the reference memory cell, and wherein in each of the memory cell and the reference memory cell, a gate of the first transistor is electrically connected to one of a source and a drain of the second transistor and an electrode of the capacitor.

6. The semiconductor device according to claim 1, further comprising a switch between the first circuit and the second circuit.

7. The semiconductor device according to claim 1, wherein the semiconductor device is configured to perform a product-sum operation.

8. A semiconductor device comprising:

a first memory cell, a second memory cell, a first reference memory cell, a second reference memory cell, a first circuit, and a second circuit, wherein the first memory cell is configured to generate a first current corresponding to a first analog potential and to generate a second current corresponding to the first analog potential and a second analog potential, wherein the second memory cell is configured to generate a third current corresponding to a third analog potential and to generate a fourth current corresponding to the third analog potential and a fourth analog potential, wherein the first reference memory cell is configured to generate a first reference current corresponding to a reference potential, wherein the second reference memory cell is configured to generate a second reference current corresponding to the reference potential, wherein the first circuit is configured to generate and hold a fifth current corresponding to a difference between a sum of the first current and the third current and a sum of the first reference current and the second reference current when the sum of the first current and the third current is smaller than the sum of the first reference current and the second reference current, wherein the second circuit is configured to generate and hold a sixth current corresponding to a difference between the sum of the first current and the third current and the sum of the first reference current and the second reference current when the sum of the first current and the third current is larger than the sum of the first reference current and the second reference current, and wherein one of the first circuit and the second circuit is configured to generate a seventh current corresponding to a fifth analog potential from a sum of the second current and the fourth current and one of the fifth current and the sixth current.

9. The semiconductor device according to claim 8, further comprising:

a first wiring electrically connected to the first circuit, the second circuit, the first memory cell, and the second memory cell; and a second wiring electrically connected to the first reference memory cell and the second reference memory cell.

10. The semiconductor device according to claim 8, further comprising:

a current source circuit;

a first wiring electrically connected to the current source circuit, the first circuit, the second circuit, the first memory cell, and the second memory cell; and a second wiring electrically connected to the current source circuit, the first reference memory cell, and the second reference memory cell.

11. The semiconductor device according to claim 8, wherein each of the first memory cell, the second memory cell, the first reference memory cell, and the second reference memory cell comprises a transistor, and wherein the semiconductor device further comprises:

a current source circuit;

a first wiring electrically connected to the current source circuit, the first circuit, the second circuit, and one of a source and a drain of the transistor of each of the first memory cell and the second memory cell; and a second wiring electrically connected to the current source circuit and one of a source and a drain of the transistor of each of the first reference memory cell and the second reference memory cell.

12. The semiconductor device according to claim 8, wherein each of the first memory cell, the second memory cell, the first reference memory cell, and the second reference memory cell comprises a first transistor, a second transistor, and a capacitor, wherein the semiconductor device further comprises:

a current source circuit;

a first wiring electrically connected to the current source circuit, the first circuit, the second circuit, and one of a source and a drain of the first transistor of each of the first memory cell and the second memory cell; and a second wiring electrically connected to the current source circuit and one of a source and a drain of the first transistor of each of the first reference memory cell and the second reference memory cell, and wherein in each of the first memory cell, the second memory cell, the first reference memory cell, and the second reference memory cell, a gate of the first transistor is electrically connected to one of a source and a drain of the second transistor and an electrode of the capacitor.

13. The semiconductor device according to claim 8, further comprising a switch between the first circuit and the second circuit.

14. The semiconductor device according to claim 8, wherein the semiconductor device is configured to perform a product-sum operation.

* * * * *